(12) United States Patent
Tanaka et al.

(10) Patent No.: US 7,859,745 B2
(45) Date of Patent: Dec. 28, 2010

(54) SEMICONDUCTOR OPTICAL AMPLIFYING DEVICE, SEMICONDUCTOR OPTICAL AMPLIFYING SYSTEM AND SEMICONDUCTOR OPTICAL INTEGRATED ELEMENT

(75) Inventors: Shinsuke Tanaka, Kawasaki (JP); Ken Morito, Kawasaki (JP); Susumu Yamazaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 246 days.

(21) Appl. No.: 12/112,373

(22) Filed: Apr. 30, 2008

(65) Prior Publication Data
US 2008/0310012 A1    Dec. 18, 2008

(30) Foreign Application Priority Data
Jun. 15, 2007    (JP)    .............................. 2007-159447

(51) Int. Cl.
*H01S 5/00* (2006.01)
(52) U.S. Cl. ................ 359/344; 372/45.01; 372/45.011; 372/45.012
(58) Field of Classification Search ................. 359/344; 372/45.01–45.012
See application file for complete search history.

(56) References Cited

U.S. PATENT DOCUMENTS

| | | | |
|---|---|---|---|
| 5,488,507 A | 1/1996 | Nishimura | |
| 6,195,188 B1 | 2/2001 | Sekiguchi | |
| 6,288,410 B1 * | 9/2001 | Miyazawa | 257/14 |
| 6,487,007 B1 | 11/2002 | Morito | |
| 6,614,822 B2 * | 9/2003 | Yoshida et al. | 372/45.01 |
| 6,803,604 B2 | 10/2004 | Takahashi et al. | |
| 7,109,526 B2 * | 9/2006 | Gentner et al. | 257/94 |
| 2002/0067541 A1 * | 6/2002 | Morito | 359/344 |
| 2002/0179929 A1 | 12/2002 | Takahashi et al. | |
| 2004/0135136 A1 * | 7/2004 | Takahashi et al. | 257/14 |
| 2006/0054899 A1 | 3/2006 | Takahashi et al. | |
| 2007/0241344 A1 * | 10/2007 | Adachi et al. | 257/79 |
| 2009/0122393 A1 * | 5/2009 | Morito et al. | 359/344 |

FOREIGN PATENT DOCUMENTS

| | | |
|---|---|---|
| JP | 7-106712 A | 4/1995 |
| JP | 8-95094 A | 4/1996 |
| JP | 10-333199 A | 12/1998 |

(Continued)

OTHER PUBLICATIONS

Okamoto et al. "TM Mode Gain Enhancement in GaInAs-InP Lasers with Tensile Strined-Layer Superlattice", IEEE Journal of Quantum Electronics, vol. 27, No. 6, pp. 1463-1469, (1991).*

(Continued)

*Primary Examiner*—Eric Bolda
(74) *Attorney, Agent, or Firm*—Westerman, Hattori, Daniels & Adrian, LLP

(57) ABSTRACT

A polarization-independent SOA having an InP substrate used as a semiconductor substrate, and an active layer taking an MQW structure formed of a barrier layer made of GaInAs with tensile strain applied thereto and a well layer made of GaInNAs with no strain applied thereto alternately laminated in a plurality of layers, here, four layers of the well layer and five layers of the barrier layer are alternately laminated, is proposed.

8 Claims, 16 Drawing Sheets

FOREIGN PATENT DOCUMENTS

| | | |
|---|---|---|
| JP | 2000-252588 A | 9/2000 |
| JP | 2001-53392 A | 2/2001 |
| JP | 2003-202529 A | 7/2003 |
| JP | 2005-175021 A | 6/2005 |

OTHER PUBLICATIONS

European Search Report dated Oct. 17, 2008, issued in corresponding European Patent Application No. 08155511.2.

Ken Morito et al; "High-Output-Power Polarization-Insensitive Semiconductor Optical Amplifer," Journal of Lightwave Technology; vol. 21; No. 1; Jan. 2003; pp. 176-181.

S. Tanaka et al; "Record high saturation output power (+20 dBm) and low NF (6.0 dB) polarisation-insensitive MQW-SOA module," Electronics Letters; Aug. 31, 2006; vol. 42; No. 18; pp. 1059-1060.

Katsuaki Magari et al; "Polarization-Insensitive Optical Amplifier with Tensile-Strained-Barrier MQW Structure," IEEE Journal of Quantum Electronics; vol. 30; No. 3; Mar. 1994; pp. 695-702.

Japanese Office Action dated Aug. 4, 2009, issued in corresponding Japanese Patent Application No. 2007-159447.

* cited by examiner

SEMICONDUCTOR OPTICAL AMPLIFYING DEVICE, SEMICONDUCTOR OPTICAL AMPLIFYING SYSTEM AND SEMICONDUCTOR OPTICAL INTEGRATED ELEMENT

CROSS-REFERENCE TO RELATED APPLICATIONS

This application is based upon and claims the benefit of priority from the prior Japanese Patent Application No. 2007-159447, filed on Jun. 15, 2007, the entire contents of which are incorporated herein by reference.

BACKGROUND

1. Field

The present invention relates to a semiconductor optical amplifying device, a semiconductor optical amplifying system and a semiconductor optical integrated element being polarization-independent having high saturation optical output power.

2. Description Of The Related Art

In order to deal with a dramatic increase in demands for communication in recent years, introduction of so-called wavelength division multiplexing (WDM) system, which realizes high-capacity transmission by a single optical fiber by way of multiplexing plural signal lights of different wavelengths, shows progress. In the WDM system, an optical power of optical signals attenuates due to a loss of respective optical parts which are used for multiplexing or demultiplexing the optical signals differed in wavelengths, so that it is indispensable to use an optical amplifier to compensate for the attenuation.

Since a semiconductor optical amplifier (SOA) is small in size, and can be designed to have a gain in a wide range of wavelength, it is expected as an optical amplifier for compensating for the loss in the WDM system.

An optical fiber used for a high-capacity optical communication system does not maintain a polarization mode of optical signals, so that the SOA is required to have a gain difference between polarizations kept at a low value. Further, when the SOA is used in a saturation region, a transmission penalty is caused because of a waveform deterioration due to a pattern effect, and a cross talk between wavelength channels, so that it is needed to use the SOA in a linear region by sufficiently enhancing saturation optical output power.

For the SOA simultaneously realizing the small gain difference between the polarizations and the high saturation optical output power as described above, the following various characteristics are required.

Requirement A: An optical gain of the SOA does not change depending on a polarization state of an input signal light. Specifically, the SOA has a small gain difference between the polarizations.

Requirement B: A gain variation of the SOA due to the wavelength of the input signal light is small. Specifically, the SOA has a flat gain spectrum.

Requirement C: A signal-to-noise ratio deterioration of the signal light caused by interposing the SOA is small. Specifically, the SOA has a small noise figure.

Requirement D: The signal light can be amplified to sufficiently high output power by SOA. Specifically, the SOA has a high saturation optical output power.

In order to introduce the SOA into the optical communication system, the SOA is needed to satisfy all the requirements A to D. Further, the characteristics of the SOA are preferable to be obtained in as a wide wavelength region as possible of 1.55 μm band which is a wavelength used especially in a long-distance communication system. Hitherto, an SOA technology fulfilling the above four requirements is developed, in which an SOA having high output power, being polarization-independent and having low noise in the wavelength band of 1.55 μm is reported (for instance, refer to Non-Patent Documents 1 and 2).

[Non-Patent Document 1] K. Morito et. al. IEEE Journal of Lightwave Technology, 2003, 21, (1), pp. 176-181.

[Non-Patent Document 2] S. Tanaka et. al. IEE Electronics Letters, vol. 42, no. 18, pp. 1059-1060, 2006.

[Non-Patent Document 3] K. Magari et. al. IEEE, Journal of Quantum Electronics, vol. 30, No. 3, 695-702 (1994)

However, in the former reported case, the flat gain wavelength characteristic (requirement B) in the wavelength band of 1.55 μm is not satisfied sufficiently. The following (1) and (2) are considered to be the reason.

(1) A band-edge wavelength of an active layer material (GaInAs (P)) shifts to a shorter wavelength side due to an effect of an tensile strain which is applied to the active layer material for realizing a polarization-independent amplification characteristic.

(2) When a current with high-density is injected into an SOA having a thin active layer in order to obtain the high saturation optical output power (requirement D), a gain peak wavelength shifts to the shorter wavelength side because of a band-filling effect caused in the active layer.

According to the effects of the above-described (1), (2), and the like, when the SOA is actually used, the gain peak wavelength shifts to the shorter wavelength side from the wavelength of 1.55 μm, resulting that a gain tilt (tilt according to a wavelength dependency of the gain) in which the gain becomes higher at the shorter wavelength side in the vicinity of the wavelength of 1.55 μm tends to be produced.

SUMMARY OF THE INVENTION

According to an aspect of an embodiment, a semiconductor optical amplifying device has a semiconductor substrate and an active layer provided over the semiconductor substrate, in which an incident signal light being incident from a end surface of the active layer (namely, a light incident end surface) is amplified to be radiated as a radiation signal light from another end surface of the active layer (namely, a light radiation end surface) while suppressing resonances of the light caused by reflections between the light incident end surface and the light radiation end surface, and a gain that the radiation signal light achieves is kept constant without depending on a polarization state of the incident signal light. The semiconductor substrate is made of InP, and the active layer takes a multiple quantum well structure formed of a barrier layer made of GaInAs with tensile strain applied thereto and a well layer made of GaInNAs alternately laminated in one or a plurality of layers.

According to an aspect of an embodiment, a semiconductor optical amplifying system has an input section inputting a signal light, a semiconductor optical amplifying device amplifying the signal light passed through the input section, an output section outputting the signal light amplified in the semiconductor optical amplifying device, and a focusing section provided at least either between the input section and the semiconductor optical amplifying device, or between the semiconductor optical amplifying device and the output section. The semiconductor optical amplifying device has a semiconductor substrate and an active layer provided over the semiconductor substrate, in which an incident signal light being incident from a light incident end surface of the active layer is amplified to be radiated as a radiation signal light from a light radiation end surface of the active layer while suppressing resonances of the light caused by reflections at the light incident end surface and the light radiation end surface, and a gain that the radiation signal light achieves is kept constant without depending on a polarization state of the incident signal light. The semiconductor substrate is made of InP, and the active layer takes a multiple quantum well structure formed of a barrier layer made of GaInAs with tensile strain applied thereto and a well layer made of GaInNAs alternately laminated in one or a plurality of layers.

According to an aspect of an embodiment, a semiconductor optical integrated element has a semiconductor substrate made of InP, and a plurality of semiconductor optical amplifying device integrated on the semiconductor substrate and configured including the semiconductor substrate. Each of the semiconductor optical amplifying device has an active layer provided over the semiconductor substrate, in which an incident signal light being incident from a light incident end surface of the active layer is amplified to be radiated as a radiation signal light from a light radiation end surface of the active layer while suppressing resonances of the light caused by reflections at the light incident end surface and the light radiation end surface, and a gain that the radiation signal light achieves is kept constant without depending on a polarization state of the incident signal light. The active layer takes a multiple quantum well structure formed of a barrier layer made of GaInAs with tensile strain applied thereto and a well layer made of GaInNAs alternately laminated in one or a plurality of layers.

BRIEF DESCRIPTION OF THE DRAWINGS

FIG. 10-1 is a schematic diagram showing a schematic configuration of a semiconductor optical integrated device according to a third embodiment;

FIGS. 10-2A to 10-2C are schematic sectional views along dashed lines I-I, II-II, and III-III in FIG. 10-1;

DETAILED DESCRIPTION OF THE PREFERRED EMBODIMENTS

—Basic Gist of Present Invention—

The present embodiment proposes an SOA having an InP substrate used as a semiconductor substrate, and an active layer taking a multiple quantum well (MQW) structure formed of a barrier layer made of GaInAs with tensile strain applied thereto and a well layer made of GaInNAs with no strain or compressive strain applied thereto alternately laminated in one or a plurality of layers.

According to this configuration, it is possible to realize not only a polarization insensitiveness by introducing the tensile strain to the barrier layer composing the active layer with the MQW structure, but also a high saturation optical output power by making a film thickness of the active layer thin, and with the use of GaInNAs in which nitrogen (N) is added to GaInAs as a material of the well layer with the MQW structure, a band-gap energy in the active layer becomes small and a gain peak wavelength becomes longer, which makes it possible to realize a high gain especially in C-band and L-band even when a band-filling exists at a time of injecting a high current into the active layer.

Further, in this case, it is possible to realize a flat gain spectrum and a low noise figure in a wide wavelength region including not only a longer wavelength side thereof but also a shorter wavelength side thereof, and to keep a small gain difference between wavelengths, while maintaining the gain peak wavelength at, for example, in the vicinity of the center of 1.55 μm band.

Figure 1:
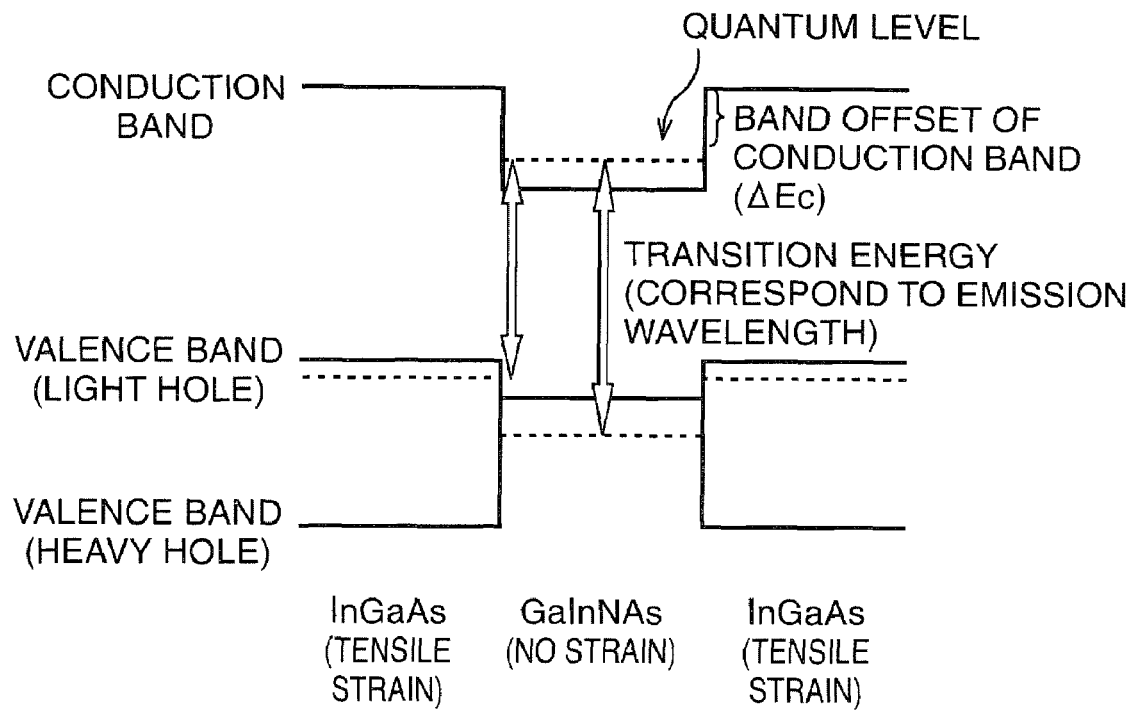
FIG. 1 is a schematic diagram showing a band state in an active layer of an SOA of the present invention.

FIG. 1 is a schematic diagram showing a band structure in the active layer of the SOA of the embodiment.

GaInNAs in which a very small amount of nitrogen is added to a GaInAs crystal possesses a smaller band-gap energy than GaInAs. By applying the GaInNAs to the well layer, comparing to an MQW structure composed of GaInAs/GaInAs (for instance, Non-Patent Document 3), inter quantum energy level transition energies between a conduction band and a valence band generated in a quantum well becomes small. The inter-quantum-level transition energy corresponds to an emission wavelength from the active layer with the quantum well structure, so that according to the structure of the present invention, comparing to the MQW structure composed of GaInAs/GaInAs, it is possible to shift the emission wavelength to the longer wavelength side. This effect is substantially the same as that of a strained bulk active layer made of GaInNAs with respect to a strained bulk active layer made of GaInAs confirmed.

The present embodiment proposes an active layer with an MQW structure in which only a well layer applies GaInNAs as a material and a barrier layer applies GaInAs as a material. This configuration enables to obtain the MQW structure possessing a large band offset of the conduction band between the well layer (GaInNAs) and the barrier layer (GaInAs) by utilizing a band-gap energy difference between GaInNAs and GaInAs, as shown in FIG. 1, for example.

By using an active layer according to the present embodiment, a quantum effect in the waveform function of electrons and holes which is a specific effect of an active layer with the MQW structure is strongly appeared, which enables to obtain such effects that a spectrum shape in the vicinity of the gain peak becomes flatten, and a noise figure in the vicinity of the gain peak wavelength is improved, compared to an active layer with a bulk structure made of GaInNAs. Further, the active layer can realize a greater band offset of the conduction band than the MQW structure composed of the well layer and the barrier layer both being made of GaInNAs. Therefore, compared to the MQW structure composed of the well layer and the barrier layer both being made of GaInNAs, a conduction band energy level in the barrier layer becomes higher while a conduction band energy level in the well layer is almost the same as that of the GaInNAs/GaInNAs MQW structure. Accordingly, the gain wavelength becomes longer while the band offset ΔEc of the conduction band becomes larger. As above, it is possible to obtain a specific quantum effect, and to exhibit a great effect in flattening the gain, and the like.

Note that, in the SOA, a polarization-independent amplification characteristic can be realized by controlling the amount of tensile strain applied to the barrier layer made of GaInAs shown in FIG. 1. Further, when a composition ratio of nitrogen (N) in the well layer made of GaInNAs is increased, an emission wavelength of the SOA is further shifted to the longer wavelength side, but, in order to set the gain peak wavelength at 1.55 μm band when the SOA is actually used, the composition ratio of nitrogen (N) added to the well layer is preferable to be about 0.05 to 0.5%. Here, when the composition ratio of nitrogen (N) is smaller than 0.05%, the emission wavelength cannot be sufficiently shifted to the longer wavelength side, and meanwhile, when it is larger than 0.5%, the gain peak wavelength is shifted further to the longer wavelength side than the target point.

From the above description, a shape of the gain spectrum of the SOA applying the present invention becomes flatten especially at a shorter wavelength side of the peak wavelength because of the introduction of quantum effect, while possessing the gain peak wavelength in the C-band band. Further, the noise figure at the shorter wavelength side of the gain peak is improved, resulting that an effective bandwidth can be greatly increased to the shorter wavelength side.

Figure 2:
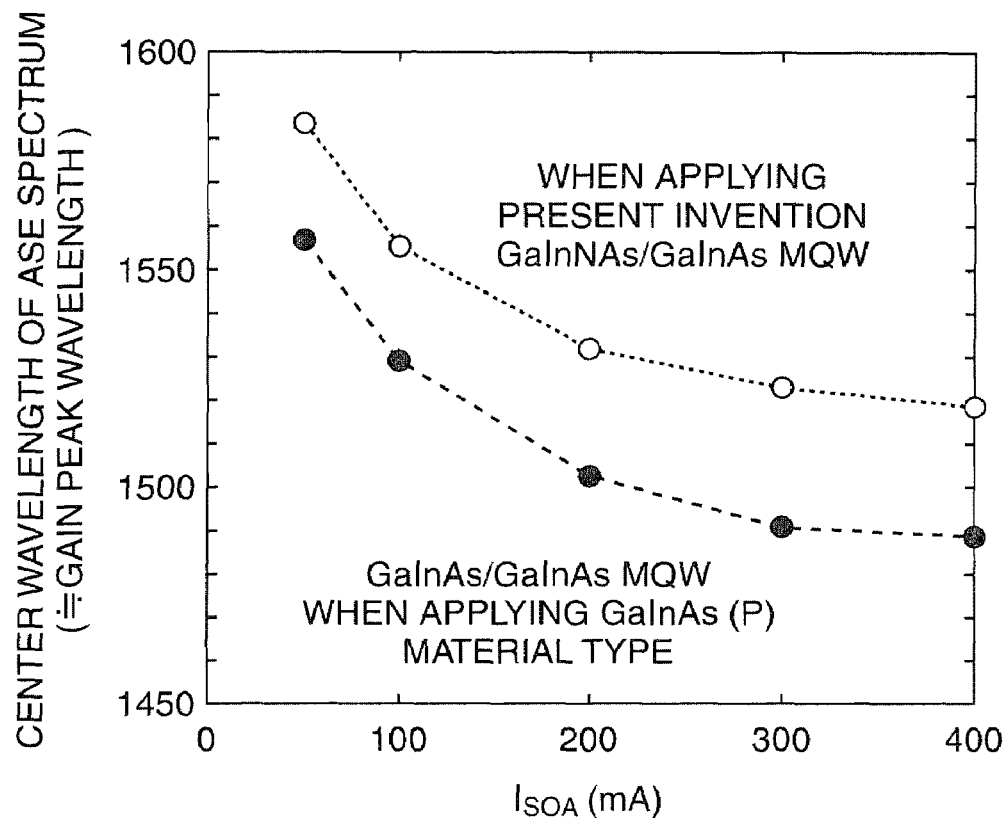
FIG. 2 is a characteristic view showing a current dependency of an ASE center wavelength (≈gain peak wavelength) measured in an SOA with an MQW structure according to the present invention.

FIG. 2 is a characteristic view showing a current dependency of an ASE center wavelength (≈gain peak wavelength) measured in the SOA with the MQW structure.

When comparing to an SOA with an MQW structure composed of GaInAs (barrier layer)/GaInAs (well layer), a center wavelength of the SOA with the MQW structure composed of GaInAs (barrier layer with tensile strain)/GaInNAs (well layer) according to the present invention is shifted as much as 25 to 35 nm to the longer wavelength side, so that a specific effect that extends the gain peak wavelength can be confirmed.

Figure 3:
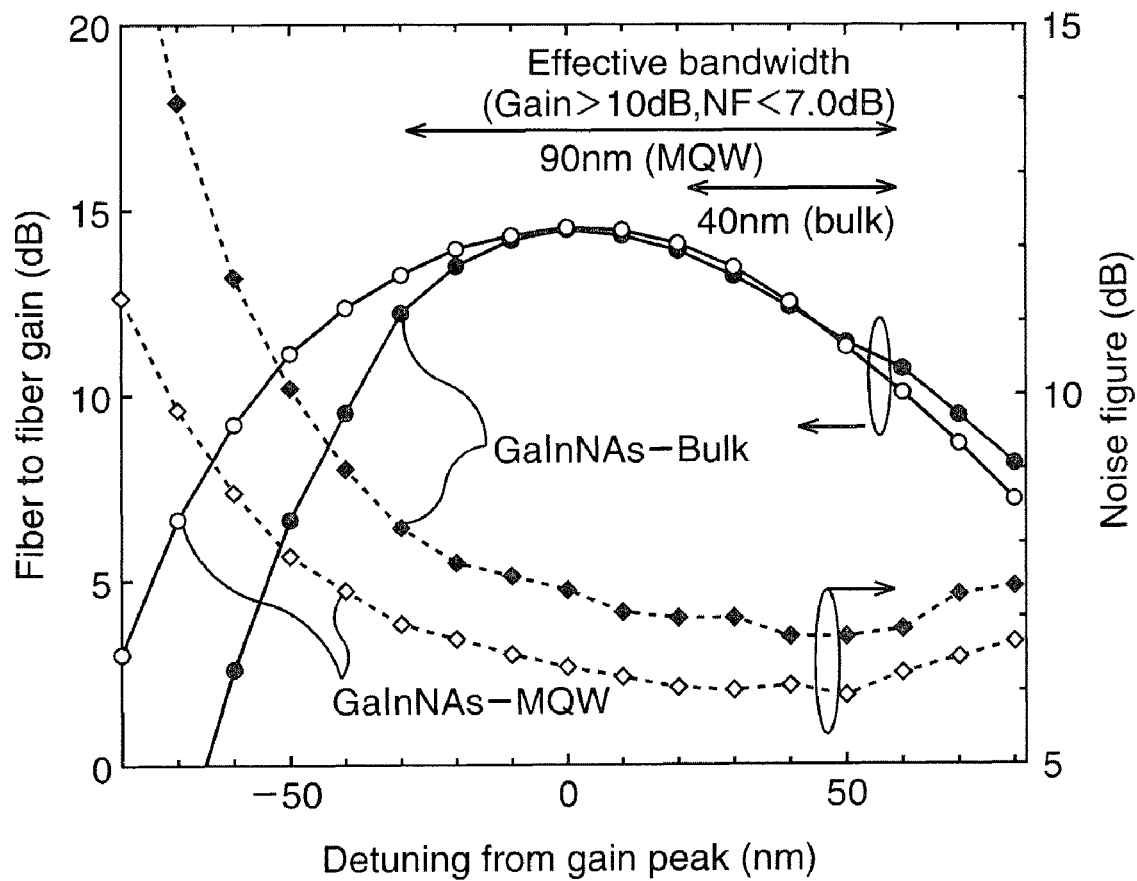
FIG. 3 is a characteristic view showing results obtained by measuring a shape of a gain spectrum and a wavelength dependency of a noise figure of the SOA with the MQW structure according to the present invention, based on a comparison with an SOA according to a technique disclosed in Application number 2006-999895.

FIG. 3 is a characteristic view showing results obtained by measuring the shape of the gain spectrum and a wavelength dependency of the noise figure of the SOA with the MQW structure according to the present invention, based on a comparison with an SOA.

In the SOA with the MQW structure composed of GaInAs (barrier layer with tensile strain)/GaInNAs (well layer: nitrogen (N) composition ratio of 0.1%), the shape of the gain spectrum at the shorter wavelength side of the gain peak wavelength is flat and the noise figure is small, compared to an SOA having an active layer with a strained bulk structure made of GaInNAs (nitrogen (N) composition ratio of 0.2%). Therefore, in the MQW structure, the effective bandwidth where the both of gain of 10 dB or larger and the noise figure of 7 dB or smaller can be obtained is increased by about 50 nm.

Figure 4:
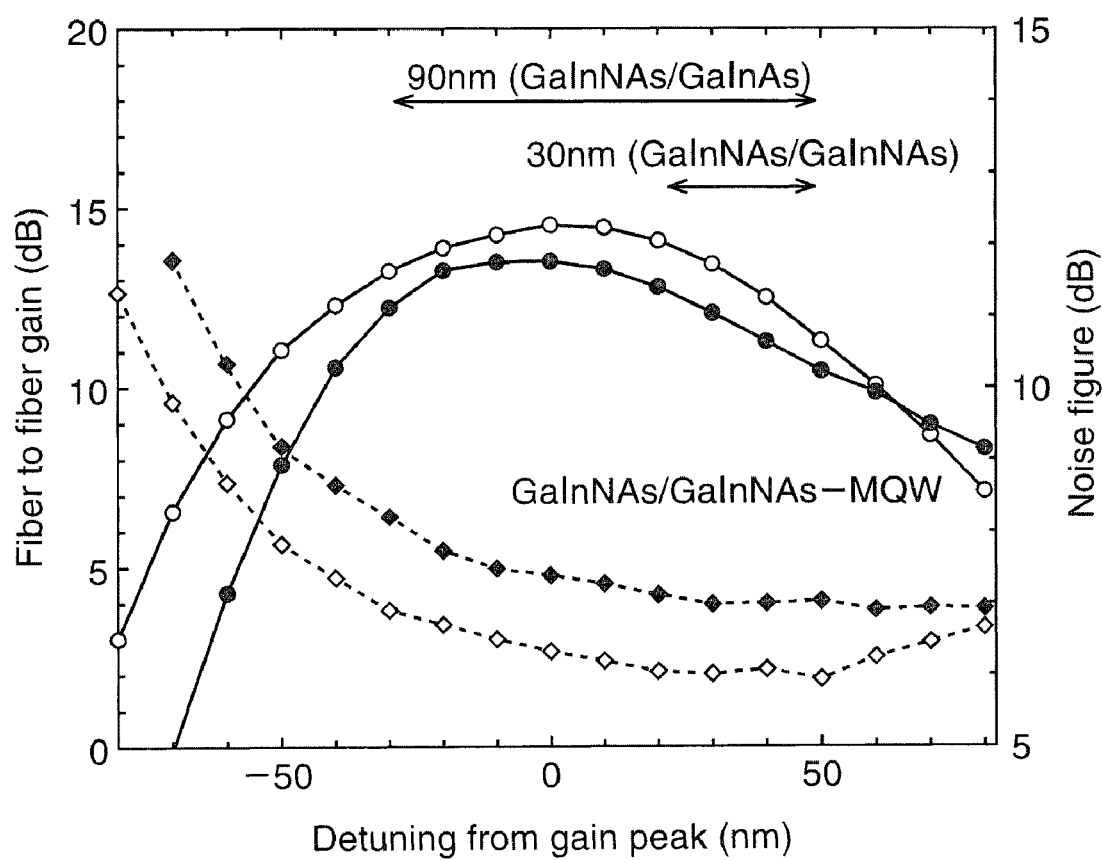
FIG. 4 is a characteristic view showing results obtained by measuring a shape of a gain spectrum and a wavelength dependency of a noise figure of the SOA with the MQW structure according to the present invention, based on a comparison with an SOA having an MQW structure formed of a well layer and a barrier layer both of which being made of GaInNAs.

FIG. 4 is a characteristic view showing results obtained by measuring the shape of the gain spectrum and the wavelength dependency of the noise figure of the SOA with the MQW structure, based on a comparison with an SOA having an MQW structure formed of a well layer and a barrier layer both of which being made of GaInNAs.

In the SOA with the MQW structure composed of GaInAs (barrier layer with tensile strain)/GaInNAs (well layer), the shape of the gain spectrum at the shorter wavelength side of the gain peak wavelength is flat and the noise figure is small compared to an SOA with an MQW structure composed of GaInNAs (barrier layer)/GaInNAs (well layer). Therefore, in the MQW structure, the effective bandwidth where both of the gain of 10 dB or larger and the noise figure of 7 dB or smaller can be obtained is increased by about 70 nm, compared to the SOA with the MQW structure composed of the well layer and the barrier layer both of which being made of GaInNAs.

In the above description, a case where the SOA with the MQW structure applies GaInNAs with no strain to the well layer in the MQW structure is described, but, it is also preferable to apply a compressive strain to the well layer. In this case, the conduction band offset between the well layer and the barrier layer can be further enlarged, so that more specific quantum effect can be utilized, resulting that an SOA with further flat shape of the gain spectrum can be realized.

First Embodiment (Configuration of SOA)

Figure 5:
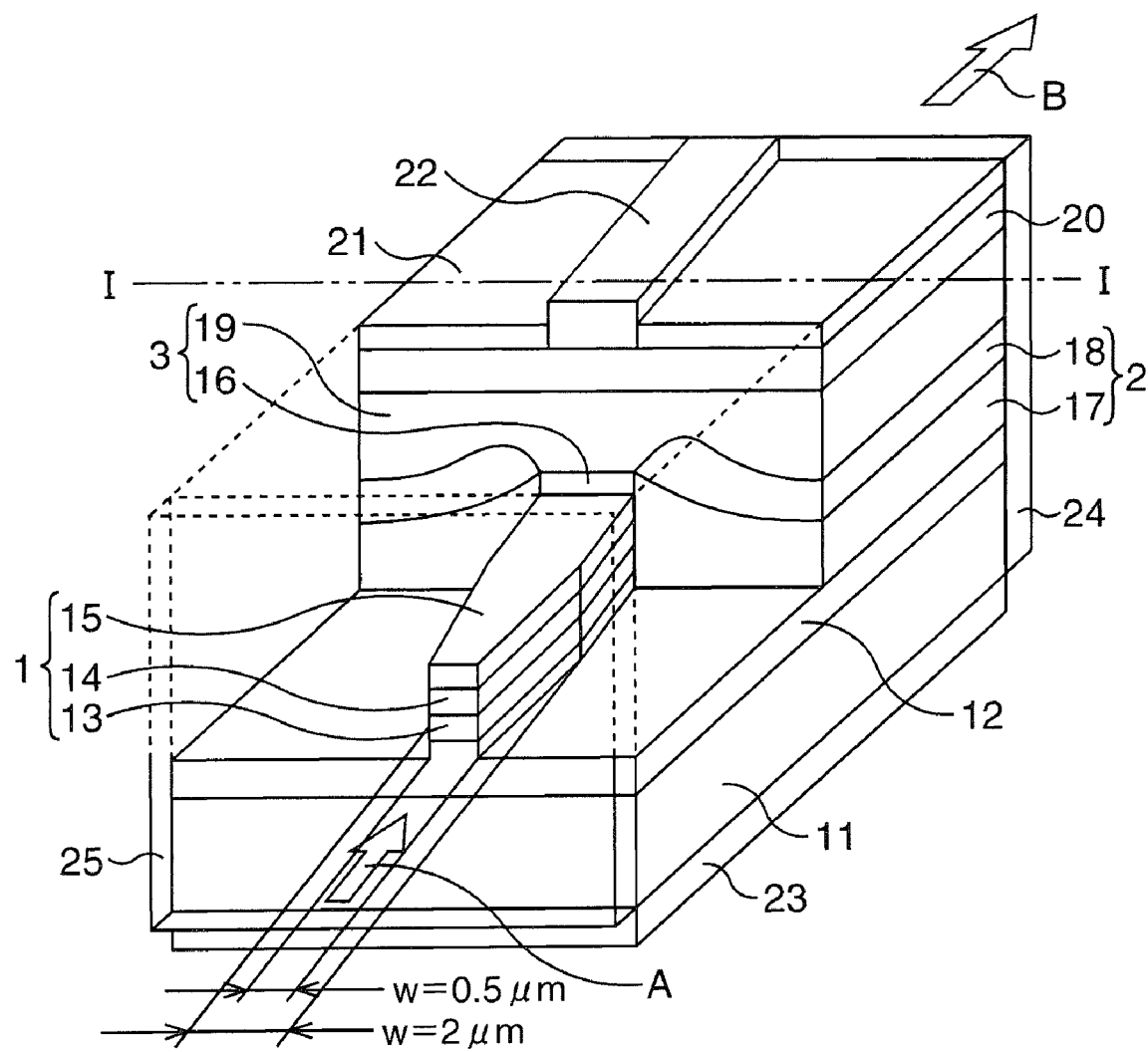
FIG. 5 is a partially cut-out perspective view showing a schematic configuration of an SOA according to a first embodiment.
Figure 6:
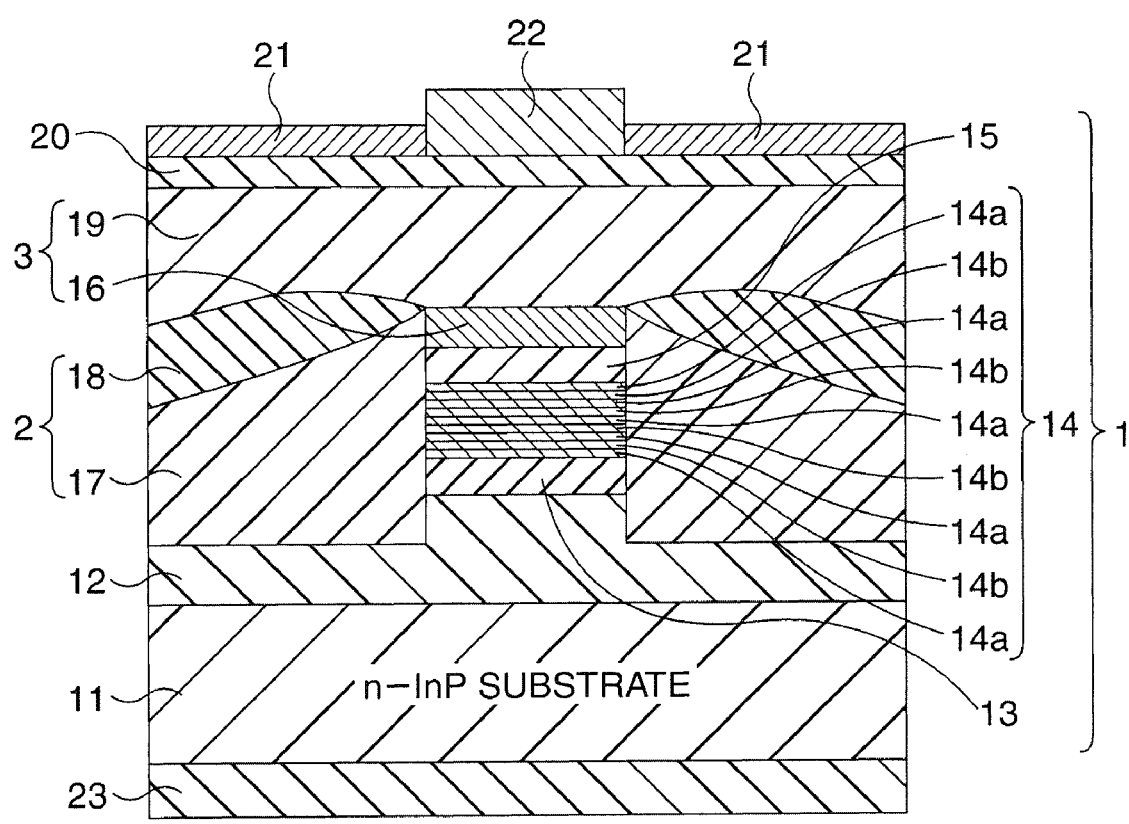
FIG. 6 is a schematic sectional view along a dashed line I-I in FIG. 5.

FIG. 5 is a partially cut-out perspective view showing a schematic configuration of the SOA according to the first embodiment, and FIG. 6 is a schematic sectional view along a dashed line I-I in FIG. 5. Here, in a front half of the SOA, in order to show a state of an active layer, illustrations of p-InP current block layers 17, n-InP current block layers 18, p-InP cladding layers 16 and 19, a p-InGaAsP contact layer 20, a silicon oxide film 21, and a p-type electrode 22 are omitted.

The SOA of the present embodiment is a polarization-independent SOA formed in an approximately rectangular parallelepiped element shape of, for instance, about 1000 μm in element length and about 300 μm in element width, having a light incident end surface and a light radiation end surface being respectively at sides of an arrow A and an arrow B, in which an incident signal light being incident from the light incident end surface as shown by the arrow A is amplified to be radiated as a radiation signal light from the light radiation end surface as shown by the arrow B, and such configuration enables a gain that the radiation signal light achieves to be kept constant without depending on a polarization state of the incident signal light.

The SOA is provided with a spot size converter 1 formed by being patterned in a band shape on an n-InP substrate 11 via an n-InP buffer layer 12 which is also serving as a lower cladding layer. Further, current constriction structures 2 are formed so as to bury the spot size converter 1 from side surfaces thereof, and an upper cladding layer 3 and the p-InGaAsP contact layer 20 are sequentially laminated to cover an upper surface of the spot size converter 1 and on the current constriction structures 2. Further, the p-type electrode 22 patterned in a band shape is provided on the p-InGaAsP contact layer 20 so as to be parallel to the spot size converter 1, and the silicon oxide film 21 is formed on the p-InGaAsP contact layer 20 to cover portions of side surfaces of the p-type electrode 22. Subsequently, non-reflective coating films 24 and 25 are respectively provided on the light incident end surface and the light radiation end surface, and an n-type electrode 23 is provided on a rear surface, to thereby configure the SOA.

The spot size converter 1 is configured such that an active layer 14 to be a path of an incident light (optical waveguide) is directly sandwiched between a pair of light confinement layers (SCH layers) 13 and 15 made of InGaAsP. The spot size converter 1 may be processed to have a band shape in which a width thereof gradually narrows from a center portion toward the respective light incident end surface and light radiation end surface, for example, to have a maximum width of about 2 μm and a minimum width of about 0.5 μm, and may be formed to have a predetermined angle of inclination, which is about 7°, for instance, with respect to a normal line of the light radiation end surface. As above, by forming the active layer 14 to have a width thereof in a tapered shape, a spot size of propagation light is enlarged, so that a coupling efficiency of light can be enhanced. Further, by making the optical waveguide take the inclined structure, resonances at the end surfaces can be suppressed, resulting that a reflectivity can be decreased.

The active layer 14 is configured to take an MQW structure in which a barrier layer 14a made of GaInAs with tensile strain applied thereto and a well layer 14b made of GaInNAs with no strain applied thereto are alternately laminated in a plurality of layers, here, five layers of the barrier layer 14a and four layers of the well layer 14b are laminated in such an order of the barrier layer 14a, the well layer 14b, and the barrier layer 14a.

A proper range of the composition ratio of nitrogen (N) in GaInNAs of the well layer 14b is about 0.05 to 0.5% when considering the gain peak wavelength is set at 1.55 μm band when the SOA is actually used, so that the composition ratio is controlled to be 0.1%, for instance.

The present embodiment describes a case where no strain is applied to the well layer 14b (strainless) as an example. Here, it is also preferable to apply a compressive strain to the well layer 14b. For instance, the compressive strain applied to GaInNAs of the well layer 14b can be obtained by forming the well layer 14b by controlling a composition ratio of gallium (Ga) and a composition ratio of indium (In) so that a lattice constant of GaInNAs becomes larger than that of the n-InP buffer layer 12. In the present embodiment, a proper range of the amount of compressive strain applied to the well layer 14b is not less than 0% nor more than 0.3%, so that the amount of compressive strain is controlled to be 0.1% (specifically, +0.1% of the amount of strain), for instance. Therefore, when GaInNAs used here is made to be $Ga_{1-x}In_xNAs$, $0.532 \leq x \leq 0.575$ is a proper range, so that the indium (In) composition ratio (x) is controlled to be 0.546 to correspond to the amount of compressive strain of 0.1%.

In this case, the band offset of the conduction band between the barrier layer 14a and the well layer 14b can be further enlarged, so that more specific quantum effect can be utilized, resulting that an SOA with further flat shape of the gain spectrum can be realized.

The tensile strain applied to GaInAs of the barrier layer 14a can be obtained by forming the barrier layer 14a by controlling the composition ratio of gallium (Ga) and the composition ratio of indium (In) so that a lattice constant of GaInAs becomes smaller than that of the n-InP buffer layer 12. In the present embodiment, a proper range of the amount of tensile strain applied to the barrier layer 14a is not less than 0.5% nor more than 1.2%, 30 that the amount of tensile strain is controlled to be 0.8% (specifically, −0.8% of the amount of strain), for instance. Therefore, when GaInAs used here is made to be $Ga_{1-x}In_xAs$, $0.36 \leq x \leq 0.46$ is a proper range, so that the indium (In) composition ratio (x) is controlled to be 0.42 to correspond to the amount of tensile strain of 0.8%.

According to the above configuration, it is possible to realize not only a polarization independence by introducing the tensile strain to the barrier layer 14a of the active layer 14 with the MQW structure, but also a high saturation optical output power by making a film thickness of the active layer 14 thin, and with the use of GaInNAs in which nitrogen (N) is added to GaInAs as a material of the well layer 14b of the active layer 14, a band-gap energy of the active layer 14 becomes small and a gain peak wavelength becomes long, which makes it possible to realize a high gain especially in C-band and L-band even when a band-filling exists at a time of injecting a high current into the active layer 14.

Further, according to the above-described configuration, it becomes possible to realize a flat gain spectrum and a low noise figure in a wide wavelength region including not only a longer wavelength side thereof but also a shorter wavelength side thereof, and to keep a small gain difference between wavelengths, while maintaining the gain peak wavelength at, for example, in the vicinity of the center of 1.55 μm band.

Here, it may be configured such that the active layer 14 does not exist in regions about 10 to 50 μm from the light incident end surface and the light radiation end surface, and a part of the upper cladding layer 3 is formed to cover tip end surfaces of the active layer 14. This configuration enables to suppress the amount of return light which couples to the spot size converter 1, and to further decrease the reflectivity.

The current constriction structure 2 is formed by sequentially laminating the p-InP current block layer 17 and the n-InP current block layer 18.

The upper cladding layer 3 is composed of the p-InP cladding layer 16 covering the upper surface of the spot size converter 1, and the p-InP cladding layer 19 covering on the p-InP cladding layer 16 and on the n-InP current block layers 18.

In the SOA according to the present embodiment, the non-reflective coating films 24 and 25 are provided on cleaved surfaces, namely, the light incident end surface and the light radiation end surface, so that the resonance of the light caused by reflections between the light incident end surface and the light radiation end surface is suppressed, and, for instance, an input signal light in the vicinity of the wavelength of 1.55 μm is amplified in the active layer 14 by an stimulated emission effect, and it is radiated as an amplified output signal light from the light radiation end surface.

(Manufacturing Method of SOA)

Hereinafter, a manufacturing method of a polarization-independent SOA according to the present embodiment will be described.

FIGS. 7A to 7D correspond to FIG. 6, and are schematic sectional views showing the manufacturing method of the polarization-independent SOA according to the present embodiment in order of step.

Figure 7A:
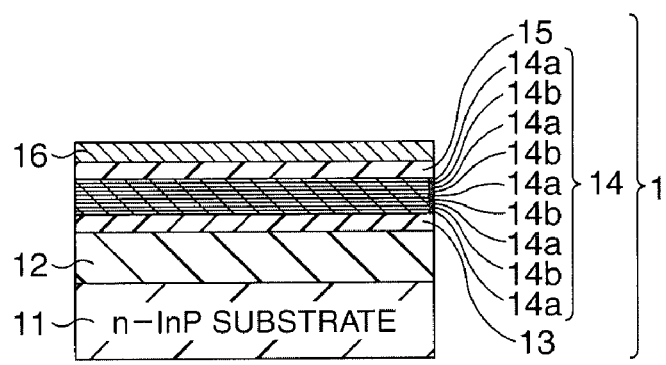
FIGS. 7A to 7D are schematic sectional views showing a manufacturing method of a polarization-independent SOA according to the present embodiment in order of step.

First, as shown in FIG. 7A, the n-InP buffer layer 12, the light confinement layer 13, the active layer 14, the light confinement layer 15, and the p-InP cladding layer 16 are sequentially formed.

Specifically, the n-InP buffer layer 12 having, for example, about 200 nm in film thickness and the light confinement layer 13 made of i-InGaAsP having, for example, about 100 nm in film thickness and an emission wavelength of about 1.3 μm are sequentially epitaxially grown on the n-InP substrate 11, using an MOCVD (metal organic chemical vapor deposition) method.

Subsequently, by using the MOCVD method, the barrier layer 14a made of GaInAs having, for example, about 10 nm in film thickness with 0.8% of tensile strain applied thereto, and the well layer 14b made of GaInNAs (nitrogen (N) composition ratio of 0.1%) having, for example, about 5 nm in film thickness with no strain applied thereto, are alternately and sequentially epitaxially grown on the light confinement layer 13 in four cycles (five layers of the barrier layer 14a and four layers of the well layer 14b are grown in such an order of the barrier layer 14a, the well layer 14b, . . . , and the barrier layer 14a), to thereby form the active layer 14 with the MQW structure.

Next, with the use of the MOCVD method, the light confinement layer 15 made of i-InGaAsP having, for example, about 100 nm in film thickness and the emission wavelength of about 1.3 μm, and the p-InP cladding layer 16 having about 200 nm in film thickness are sequentially deposited.

Figure 7B:
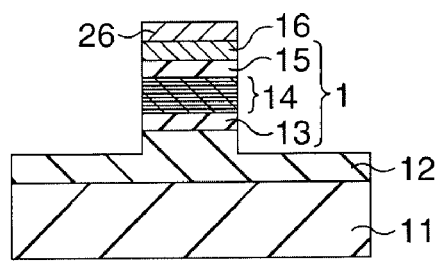

Subsequently, as shown in FIG. 7B, a stripe-shaped mesa structure composed of a part of a surface layer of the n-InP buffer layer 12, the light confinement layer 13, the active layer 14, the light confinement layer 15, and the p-InP cladding layer 16 is formed.

Specifically, a silicon oxide film 26, after being deposited on the whole surface, is processed in a stripe shape having a width of 1.0 to 4.0 μm, for instance, about 2.0 μm.

Here, the silicon oxide film 26 may be formed to have a major axis thereof inclined 5° to 20°, for instance, 7° with respect to the normal line of the light radiation end surface, using, for example, a direct contact exposure method.

Subsequently, by using this stripe-shaped silicon oxide film 26 as a mask, the p-InP cladding layer 16, the light confinement layer 15, the active layer 14, and the light confinement layer 13 are mesa-etched until they reach a part of the surface layer of the n-InP buffer layer 12, using, for example, an ICP-reactive ion etching (RIE). Accordingly, the stripe-shaped mesa structure having a height of, for example, about 1.5 μm, and a width w of the active layer of 1.0 to 4.0 μm, for instance, about 2.0 μm is formed.

At this time, in the final element structure, the width w of the active layer 14 may be formed in a tapered shape so that the width w becomes gradually narrow from about 2.0 μm to about 1.0 μm, from the center portion toward the light incident end surface and the light radiation end surface, in order to enhance the optical coupling efficiency.

Figure 7C:
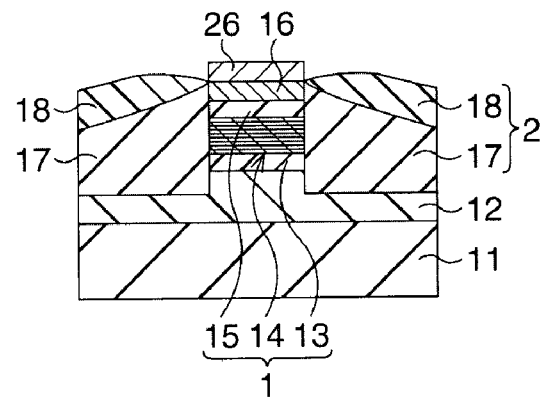

Next, as shown in FIG. 7C, the current constriction structures 2 are formed.

Specifically, by continuously employing the silicon oxide film 26 as a mask for selective growth, the p-InP current block layers 17 and the n-InP current block layers 18 are selectively grown on both side walls of the stripe-shaped mesa structure using the MOCVD method, to thereby form the current constriction structures 2.

Figure 7D:
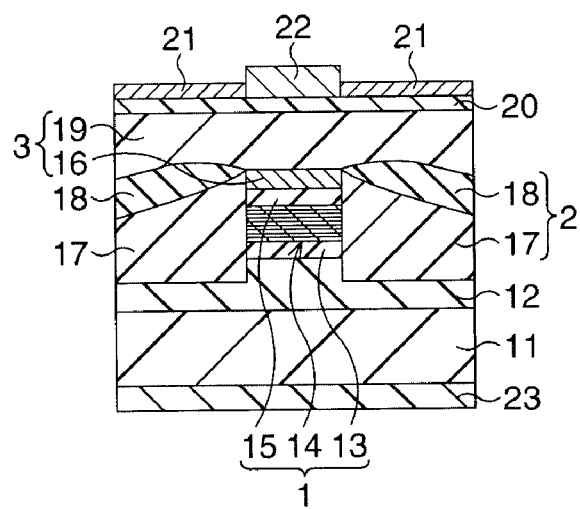

Subsequently, as shown in FIG. 7D, the p-InP cladding layer 19, the p-InGaAsP contact layer 20, the silicon oxide film 21, the p-type electrode 22 and the n-type electrode 23 are sequentially formed.

Specifically, after removing the silicon oxide film 26 used as the mask by wet etching and the like, the p-InP cladding layer 19 and the p-InGaAsP contact layer 20 are sequentially deposited on the whole surface using the MOCVD method.

Next, the silicon oxide film 21 is deposited on the whole surface, an opening portion overlapped in projection with the stripe-shaped mesa structure is formed, and thereafter, the p-type electrode 22 is formed and the n-type electrode 23 is formed on the rear surface of the n-InP substrate 11.

Subsequently, as shown in FIG. 6, the n-InP substrate 11 on which the p-type electrode 22 and the n-type electrode 23 are formed is cleaved along the cleaved surfaces in an array with an element length of about 1 mm, and after that, the non-reflective coating films 24 and 25 are deposited on the cleaved surfaces. By forming the non-reflective coating films 24 and 25, the reflectivity of both end surfaces can be suppressed at, for instance, $1 \times 10^{-5}$ or lower, resulting that an SOA having an amplification characteristic in which the gain spectrum is flat with no ripple is realized.

Further, the array is cleaved into a chip.

By performing the above processes, a basic configuration of the polarization-independent SOA according to the present embodiment is completed.

As described above, according to the present embodiment, it is possible to realize a highly reliable SOA capable of realizing the flat gain spectrum and the low noise figure in the wide wavelength region including not only the longer wavelength side thereof but also the shorter wavelength side thereof, and keeping the small gain difference between the wavelengths, while maintaining the gain peak wavelength at, for example, in the vicinity of the center of 1.55 μm band.

MODIFIED EXAMPLE

Here, a modified example of the first embodiment will be described.

Figure 8:
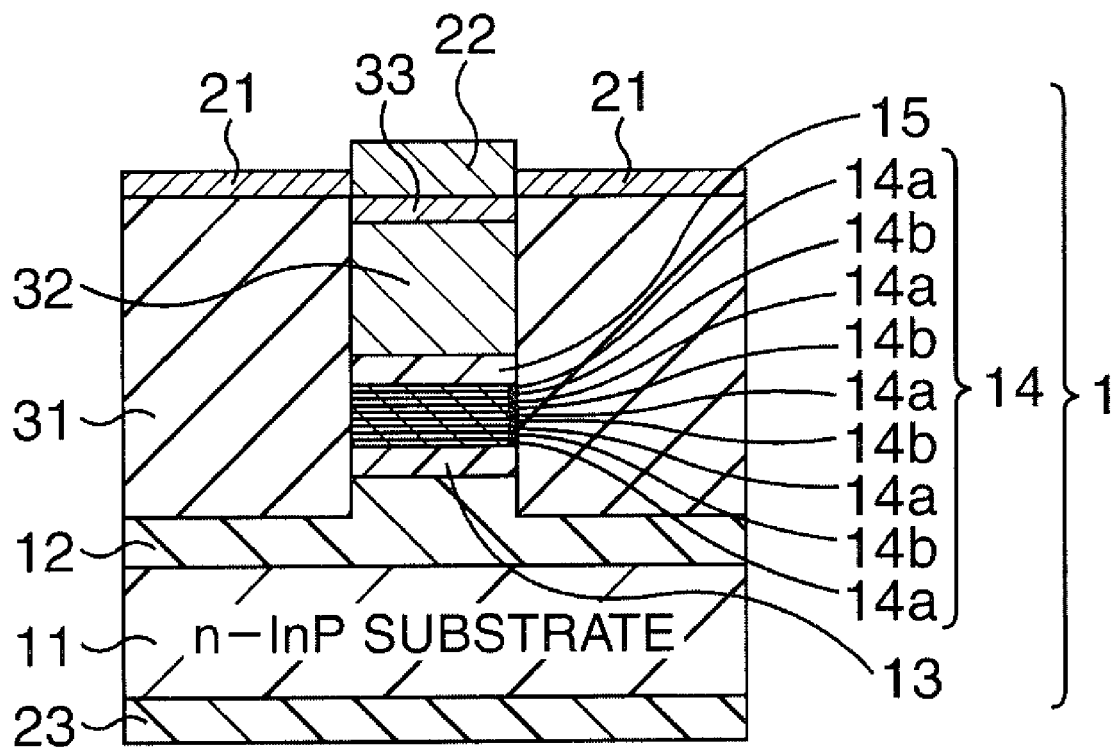
FIG. 8 is a schematic sectional view showing an SOA according to a modified example of the first embodiment.

FIG. 8 shows an SOA according to the modified example of the first embodiment, and is a schematic sectional view corresponding to FIG. 6 according to the first embodiment.

The SOA of the present example is configured in substantially the same manner as the SOA of the first embodiment, but, it differs in that current constriction structures 31 composed of semi-insulating InP current block layers and possessing higher resistance than the current constriction structures 2 are formed, instead of the current constriction structures 2 formed by sequentially laminating the p-InP current block layers 17 and the n-InP current block layers 18.

Note that, along with the formation of the current constriction structures 31, a p-InP cladding layer 32 being an upper cladding layer covering only the upper surface of the spot size converter 1 is formed, instead of the upper cladding layer 3 composed of the p-InP cladding layers 16 and 19. Further, instead of the p-InGaAsP contact layer 20, a p-InGaAsP contact layer 33 covering only an upper surface of the p-InP cladding layer 32 is formed.

In order to manufacture the polarization-independent SOA of the above-described configuration, first, similar to the first embodiment, the n-InP buffer layer 12, the light confinement layer 13, the active layer 14 with the MQW structure, the light confinement layer 15, the p-InP cladding layer 32, and the p-InGaAsP contact layer 33 are sequentially formed using the MOCVD method. Here, the p-InP cladding layer 32 and the p-InGaAsP contact layer 33 are respectively formed to have, for example, about 1500 nm and about 500 nm in film thickness. Subsequently, similar to the first embodiment, by using the stripe-shaped silicon oxide film 26 as a mask, mesa etching is conducted until reaching a part of the surface layer of the n-InP buffer layer 12, using the ICP-RIE. Accordingly, a stripe-shaped mesa structure having, for example, a height of about 3 µm, and a width w of the active layer of 1.0 to 4.0 µm, for instance, about 2.0 µm, composed of the part of the surface layer of the n-InP buffer layer 12, the light confinement layer 13, the active layer 14, the light confinement layer 15, the p-InP cladding layer 32, and the p-InGaAsP contact layer 33 is formed.

Next, by continuously employing the silicon oxide film 26 as a mask for selective growth, the current constriction structures 31 having high resistance and made of the semi-insulating InP (SI-InP), are formed on side walls of the stripe-shaped mesa structure using the MOCVD method.

Subsequently, similar to the first embodiment, after removing the silicon oxide film 26 used as the mask, the silicon oxide film 21 is deposited on the whole surface, an opening portion overlapped in projection with the stripe-shaped mesa structure is formed, and thereafter, the p-type electrode 22 is formed and the n-type electrode 23 is formed on the rear surface of the n-InP substrate 11.

Subsequently, the n-InP substrate 11 on which the p-type electrode 22 and the n-type electrode 23 are formed is cleaved along the cleaved surfaces in an array with an element length of about 1 mm, and after that, the non-reflective coating films 24 and 25 are deposited on the cleaved surfaces. By forming the non-reflective coating films 24 and 25, the reflectivity of both end surfaces can be suppressed at, for instance, $1 \times 10^{-5}$ or lower, resulting that an SOA having an amplification characteristic in which the gain spectrum is flat with no ripple is realized.

Further, the array is cleaved into a chip.

By performing the above processes, a basic configuration of the polarization-independent SOA according to the present example is completed.

As described above, according to the present example, it is possible to realize a highly reliable SOA capable of realizing a flat gain spectrum and a low noise figure in a wide wavelength region including not only a longer wavelength side thereof but also a shorter wavelength side thereof, and capable of keeping a small gain difference between wavelengths, while maintaining a gain peak wavelength at, for example, in the vicinity of the center of 1.55 µm band.

Second Embodiment

The present embodiment discloses an SOA module being a system configuration applying the SOA of the first embodiment. Note that, instead of the SOA of the first embodiment, the one of the modified example thereof can also be applied.

Figure 9:
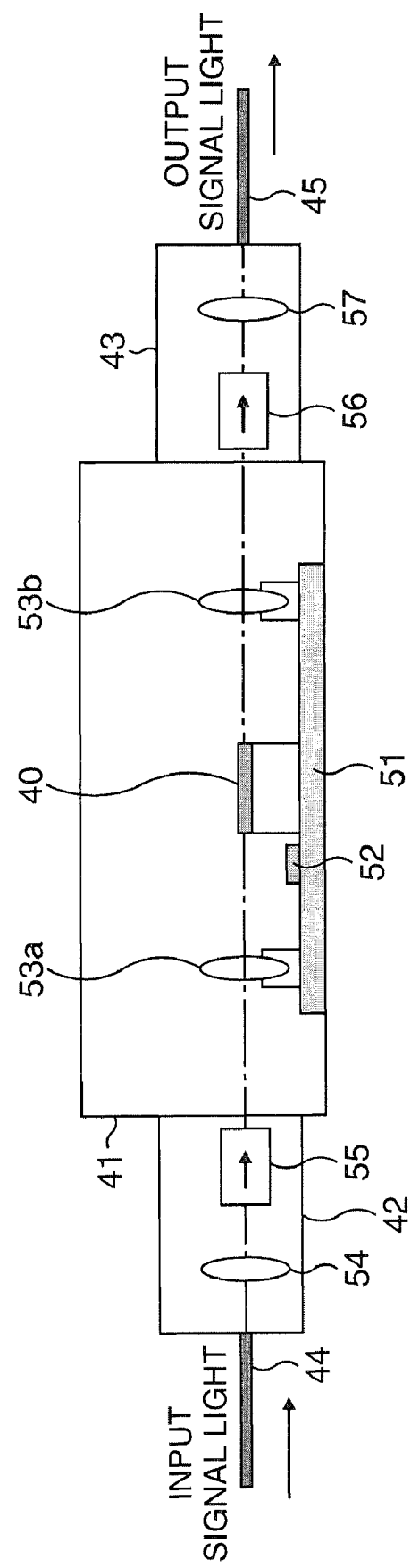
FIG. 9 is a schematic diagram showing a schematic configuration of an SOA module according to a second embodiment.

FIG. 9 is a schematic diagram showing a schematic configuration of the SOA module according to the second embodiment.

The SOA module of the present embodiment is configured to have an SOA module case 41, a pair of connected module cases 42 and 43 provided in front and rear of the SOA module case 41, and optical fibers 44 and 45 provided to the respective connected module cases 42 and 43.

The SOA module case 41 is configured to include inside thereof a Peltier element 51, and on the Peltier element 51, there are provided an SOA 40, a thermistor 52, and a pair of focusing lenses 53a and 53b.

The SOA 40 is an SOA according to the first embodiment, in which the active layer 14 with the MQW structure is the optical waveguide. Note that, regarding the SOA 40, only the n-InP substrate 11 and the spot size converter 1 are shown, for the sake of illustration.

The Peltier element 51 and the thermistor 52 appropriately control a temperature of the SOA 40.

The pair of focusing lenses 53a and 53b being disposed in front and rear of the SOA 40 condense a signal light and point its direction.

The connected module case 42 is provided on an upstream portion of the SOA module case 41, and it is configured to include inside thereof a focusing lens 54 and an isolator 55.

The connected module case 43 is provided on a downstream portion of the SOA module case 41, and it is configured to include inside thereof an isolator 56 and a focusing lens 57.

The isolators 55 and 56 control the signal light inside of the connected module cases 42 and 43 to travel in one direction, in which a reflected light in the module generated in the SOA 40, the focusing lenses 53a and 53b, and the like is suppressed to return to the optical fiber 44 at an input side, and a reflected light from the outside of the module is suppressed to enter the SOA 40.

In the SOA module, an optical signal passed through the optical fiber 44 enters the connected module case 42, passes through the focusing lens 54, and after a traveling direction thereof is controlled in one direction by the isolator 55, it enters the SOA module case 41. In the SOA module case 41, the optical signal passed through the focusing lens 53a passes through the spot size converter 1 (active layer 14) of the SOA 40 controlled and adjusted by the Peltier element 51 and the thermistor 52, and, after being optically amplified, it passes through the focusing lens 53b to enter the connected module case 43. Subsequently, the signal light passes through the focusing lens 57 after being controlled to travel in one direction by the isolator 56, and it is outputted through the optical fiber 45.

Note that the SOA module disclosed in the present embodiment is only an example adopting the present invention, and the present invention is not limited to the above-described respective composing members and disposition states thereof.

As described above, according to the present embodiment, it is possible to realize a highly reliable SOA module capable of realizing a flat gain spectrum and a low noise figure in a wide wavelength region including not only a longer wavelength side thereof but also a shorter wavelength side thereof, and capable of keeping a small gain difference between wavelengths, while maintaining a gain peak wavelength at, for example, in the vicinity of the center of 1.55 µm band.

Third Embodiment

The present embodiment discloses an optical gate switch being a semiconductor optical integrated element applying a plurality of SOAs according to the modified example of the first embodiment, provided on a single semiconductor substrate. Note that, instead of the SOA of the modified example, the one of the first embodiment can also be applied.

(Configuration of Optical Gate Switch)

Figures 1, 10:
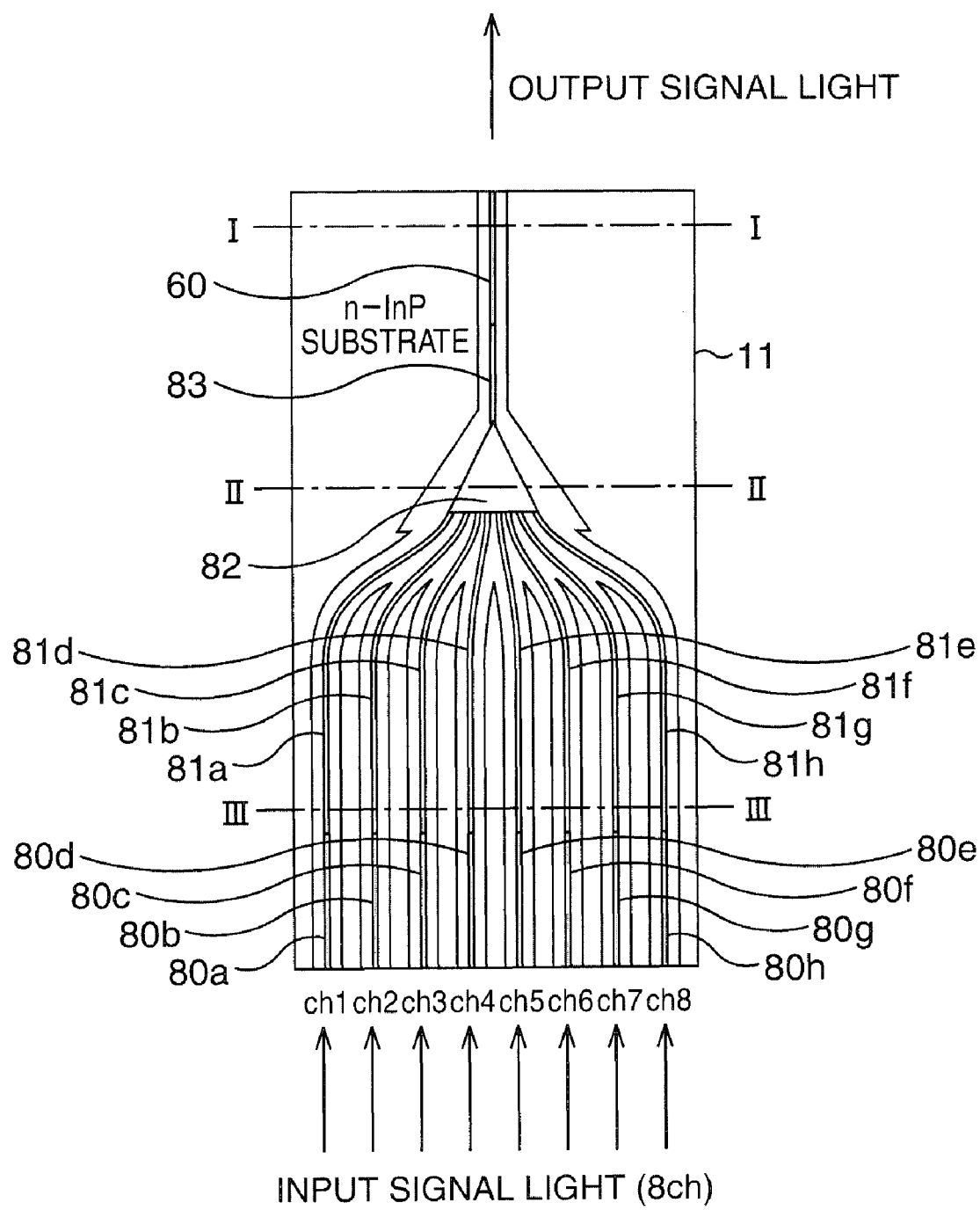
Figures 2A, 10:
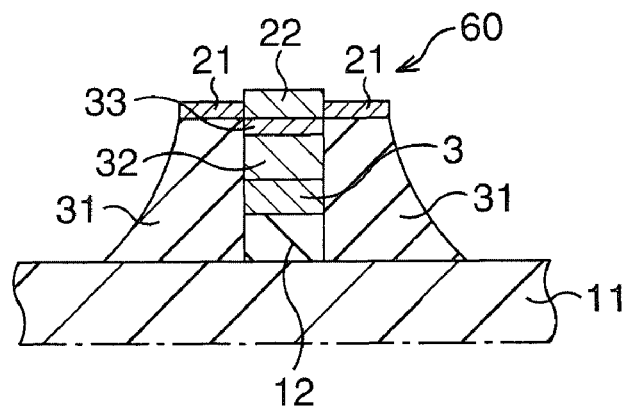
Figures 2B, 10:
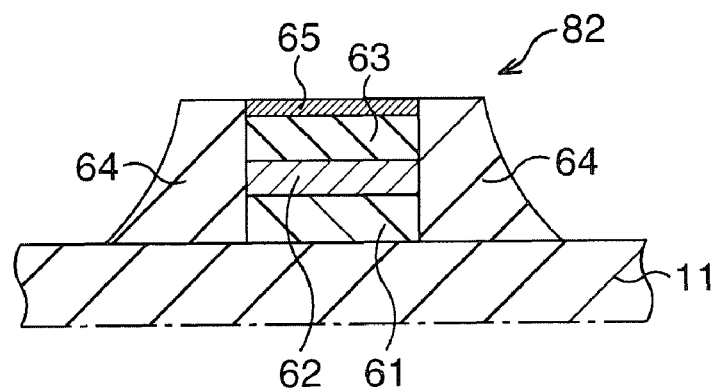
Figures 2C, 10:
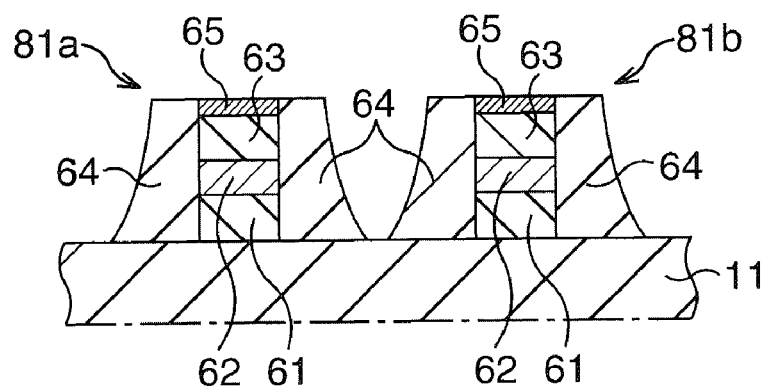

FIG. 10-1 is a schematic diagram showing a schematic configuration of an optical gate switch of the third embodiment, FIG. 10-2A is a schematic sectional view along a dashed line I-I in FIG. 10-1, FIG. 10-2B is a schematic sectional view along a dashed line II-II in FIG. 10-1, and FIG. 10-2C is a schematic sectional view along a dashed line III-III in FIG. 10-1. Note that, for the sake of illustration, only two optical waveguide portions 81a and 81b are shown in FIG. 10-2C.

The optical gate switch of the present embodiment having an 1×8 channel structure is configured to have a plurality of, here, eight SOAs 80a to 80h integrated in parallel on a single n-InP substrate 11, optical waveguide portions 81a to 81h respectively connected to the SOAs 80a to 80h at one ends thereof, an optical coupler 82 connected to the other ends of the optical waveguide portions 81a to 81h, an optical waveguide portion 83 connected to the optical coupler 82 at one end thereof, and an SOA 60 connected to the other end of the optical waveguide portion 83.

Each of the SOAs 80a to 80h and 60 configures the SOA according to the modified example of the first embodiment together with the n-InP substrate 11, in which the active layer 14 with the MQW structure is the optical waveguide. The SOAs 80a to 80h are input channels ch1 to ch8 of the signal light, which are lined in this order, for instance, and the SOA 60 is an output channel of the signal light.

FIG. 10-2A shows a schematic section of the SOA 60 and, for the sake of illustration, among the composing members in FIG. 8, only the n-InP substrate 11, the n-InP buffer layer 12, the spot size converter 1 composed of the light confinement layer 15, the active layer 14, and the light confinement layer 13, the p-InP cladding layer 32, the p-InGaAsP contact layer 33, the current constriction structures 31 made of the semi-insulating InP current block layers covering both side surfaces of the above-described members, the silicon oxide film 21, and the p-type electrode 22 are shown.

The optical waveguide portions 81a to 81h connect the SOAs 80a to 80h with the optical coupler 82, and are butt-jointed to the SOAs 80a to 80h, as shown in FIG. 10-2C. The optical waveguide portion 83 connects the optical coupler 82 with the SOA 60, and is butt-jointed to the SOA 60.

A stripe-shaped mesa structure formed by laminating an n-InP cladding layer 61 made by processing the same material as of the n-InP buffer layer 12 of the SOAs 80a to 80h and 60, a core layer 62 to be an optical waveguide made of the material having a band-gap energy wider than that of the signal light, for instance, i-InGaAsP, a p-InP cladding layer 63, and a p-InGaAsP contact layer 65, is formed, and current constriction structures 64 made of the same material (semi-insulating InP) as of the current constriction structures 31 of the SOAs 80a to 80h and 60 are provided so as to cover both sides of the stripe-shaped mesa structure, to thereby configure the optical waveguide portions 81a to 81h and 83.

As shown in FIG. 10-2B, the optical coupler 82 is simultaneously formed with the optical waveguide portions 81a to 81h and 83 using the same material. Here, when forming the mesa structure, different from the optical waveguide portions 81a to 81h and 83, a triangular-shaped mesa structure is formed by being processed to have a triangular shape in plan view as shown in FIG. 10-1, for example, and the current constriction structures 64 are formed to cover a periphery of the triangular-shaped mesa structure, to thereby configure the optical coupler 82.

In the optical gate switch of the present embodiment, signal lights enter the respective SOAs 80a to 80h being ch1 to ch8, and the respective signal lights are amplified to enter the optical coupler 82 through the optical waveguide portions 81a to 81h. In the optical coupler 82, the signal lights being incident from the optical waveguide portions 81a to 81h are multiplexed to be outputted to the optical waveguide portion 83. The signal light passed through the optical coupler 82 passes through the optical waveguide portion 83, and is outputted after being amplified by the following SOA 60.

The SOA generates an optical gain when a current is injected therein, and it absorbs light with a very high efficiency when the current is not injected therein, so that a role of the optical gate can be realized by turning on/off the current. In the present embodiment, a current source (not shown) from which a current is freely injected into the respective SOAs 80a to 80h is provided, and by configuring such that the current is injected into only one of the SOAs selected from the SOAs 80a to 80h, and no current is injected into the other seven SOAs, using this current source, it is controlled such that only the signal light from the one optical waveguide portion passes through the optical coupler 82.

The SOA 60 is disposed to compensate for optical loss (theoretically, 9 dB or more, in a case of 1×8 ch structure) generated in the optical coupler 82, and by keeping injecting the current into the SOA 60 all the time, an optical amplification function can be realized by the whole optical gate switch.

(Manufacturing Method of Optical Gate Switch)

Hereinafter, a manufacturing method of the polarization-independent optical gate switch according to the present embodiment will be explained.

Figure 11:
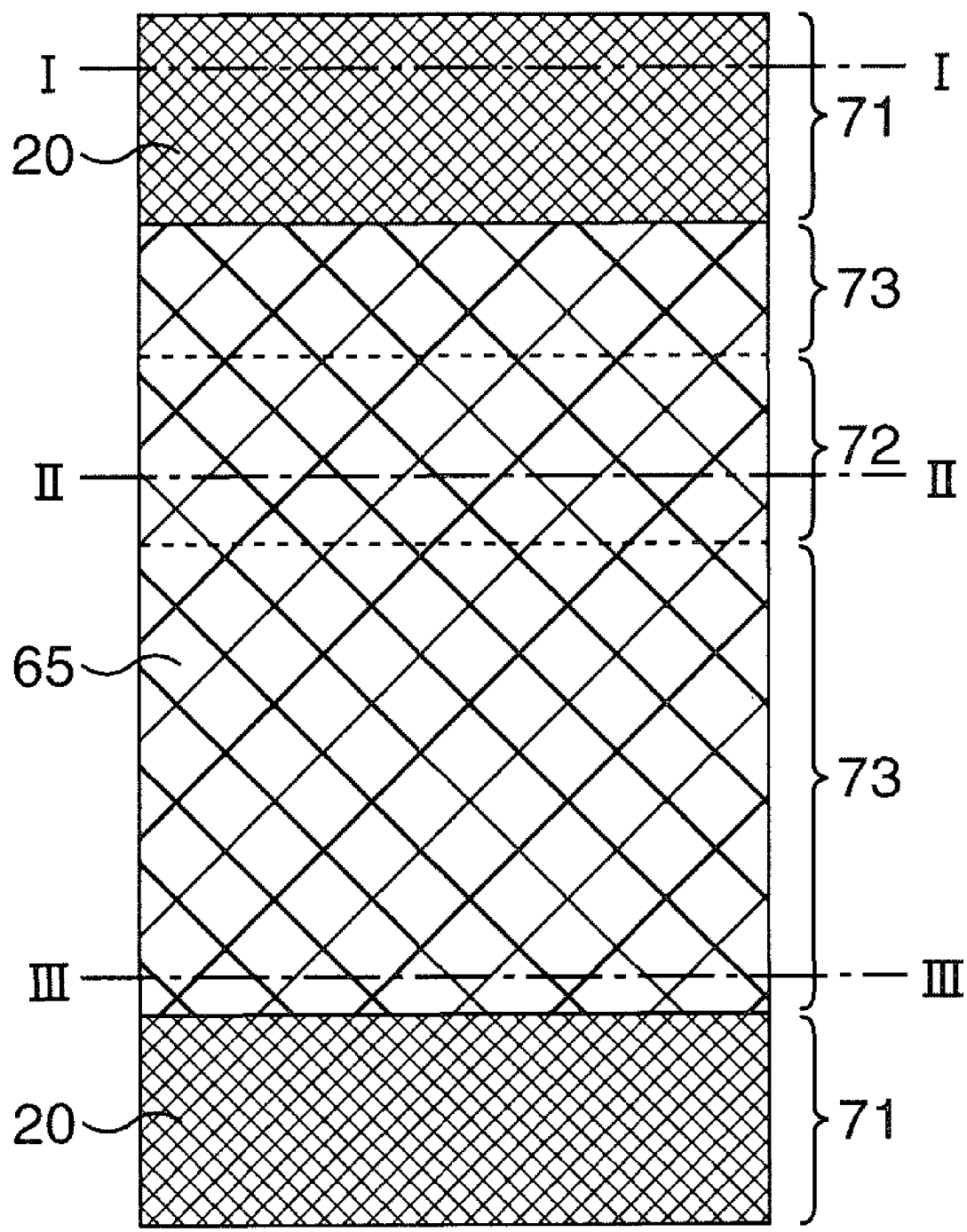
FIG. 11 is a schematic plan view showing a manufacturing method of a polarization-independent optical gate switch according to the third embodiment in order of step.
Figure 12:
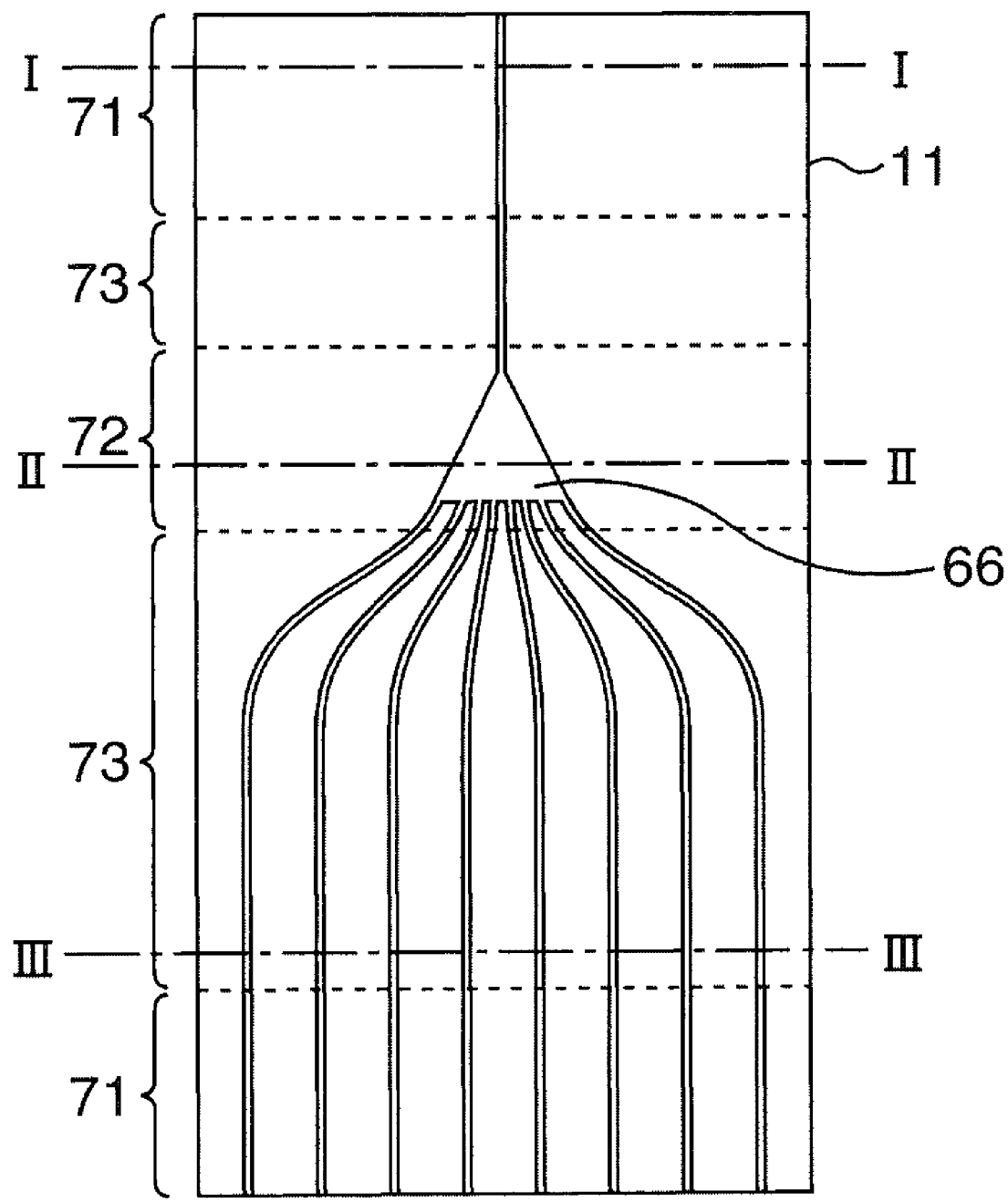
FIG. 12 is a schematic plan view showing the manufacturing method of the polarization-independent optical gate switch according to the third embodiment in order of step.
Figure 13:
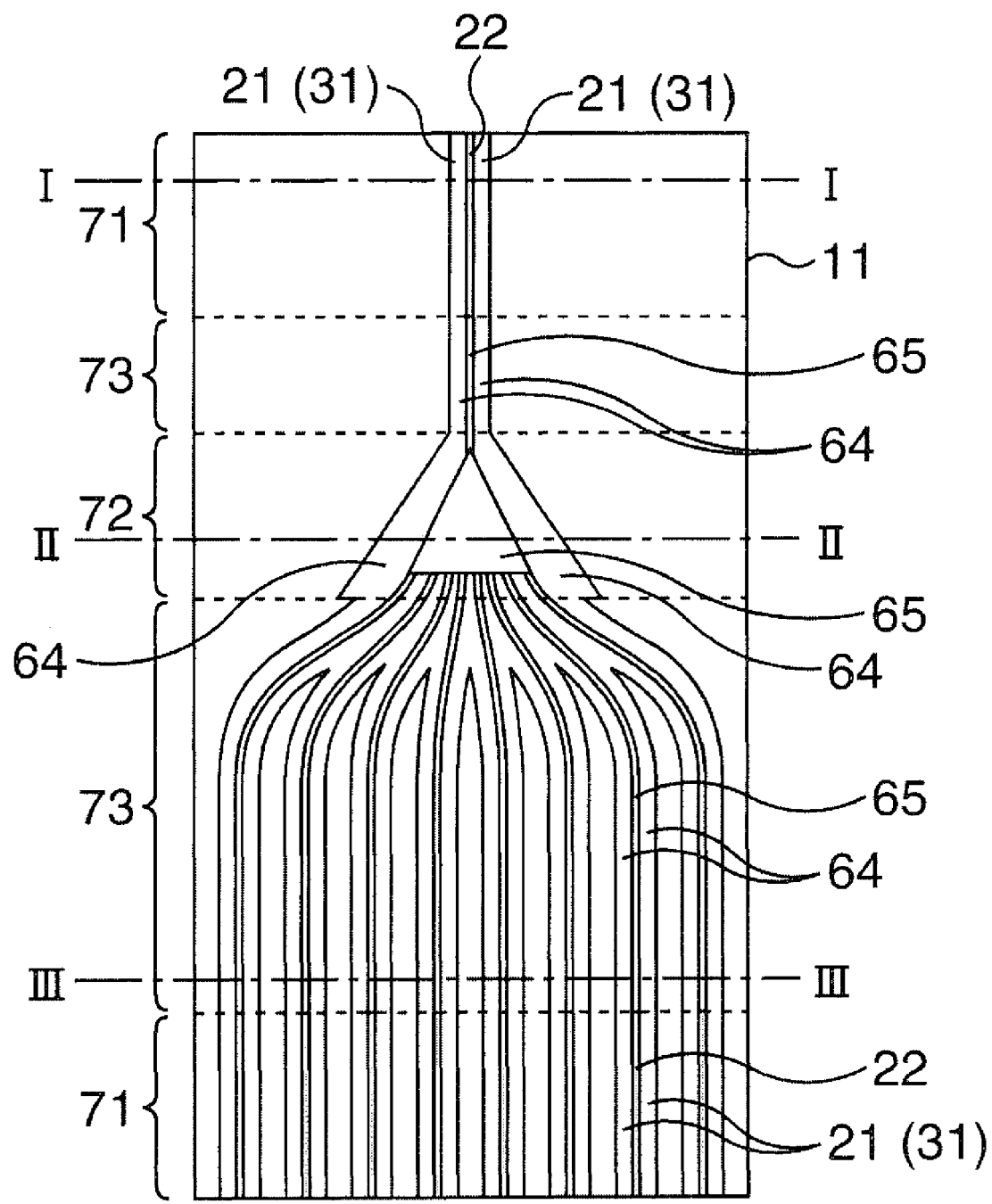
FIG. 13 is a schematic plan view showing the manufacturing method of the polarization-independent optical gate switch according to the third embodiment in order of step.
Figure 14A:
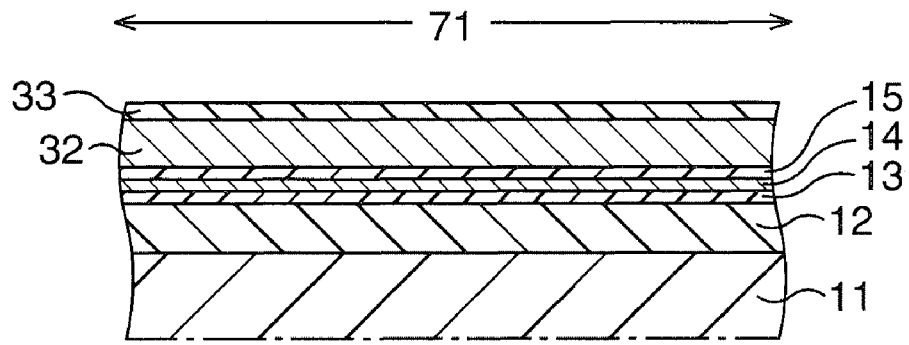
FIGS. 14A to 14C are schematic sectional views along dashed lines I-I, II-II, and III-III in FIG. 11.
Figure 14B:
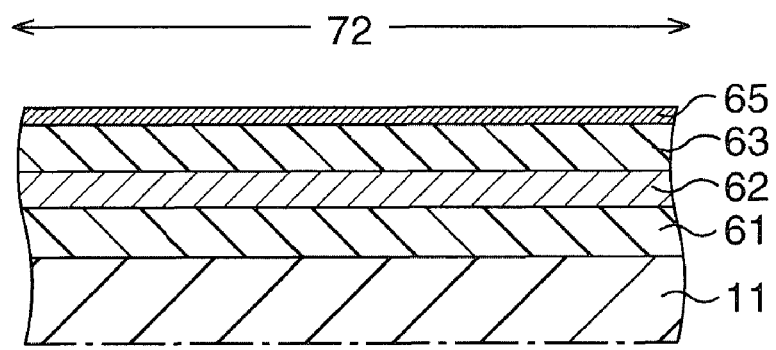
Figure 14C:
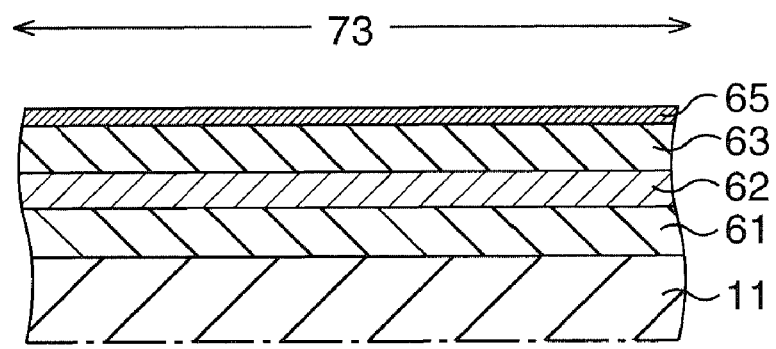

FIG. 11, FIG. 12, and FIG. 13 are schematic plan views showing the manufacturing method of the polarization-independent optical gate switch according to the present embodiment in order of step. FIGS. 14A to 14C are schematic sectional views along dashed lines I-I, II-II, and III-III in FIG. 11, FIGS. 15A to 15C are schematic sectional views along dashed lines I-I, II-II, and III-III in FIG. 12, and FIGS. 16A to 16C are schematic sectional views along dashed lines I-I, II-II, and III-III in FIG. 13.

Figure 15A:
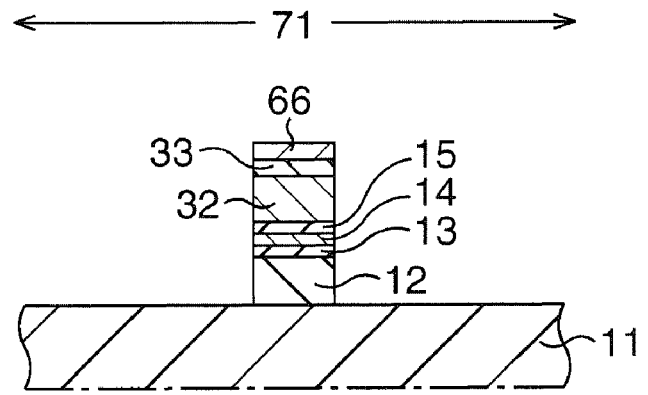
FIGS. 15A to 15C are schematic sectional views along dashed lines I-I, II-II, and III-III in FIG. 12.
Figure 15B:
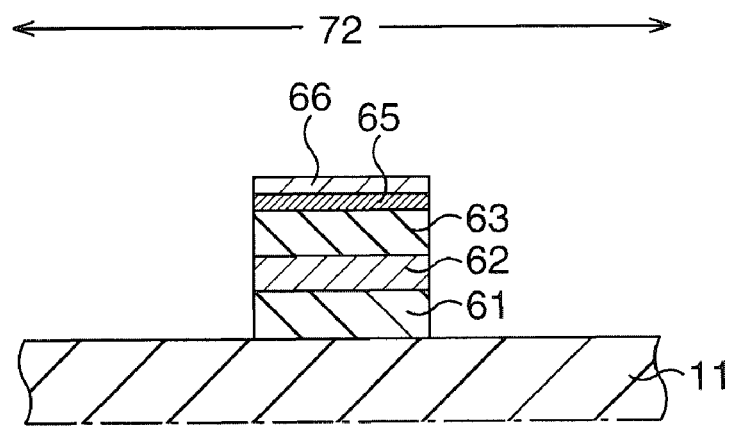
Figure 15C:
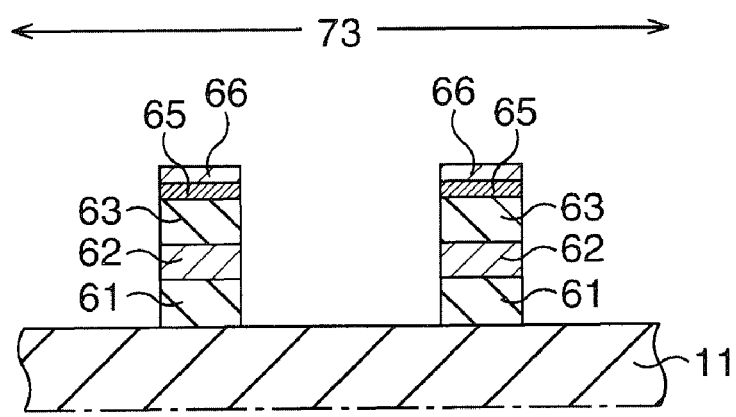
Figure 16A:
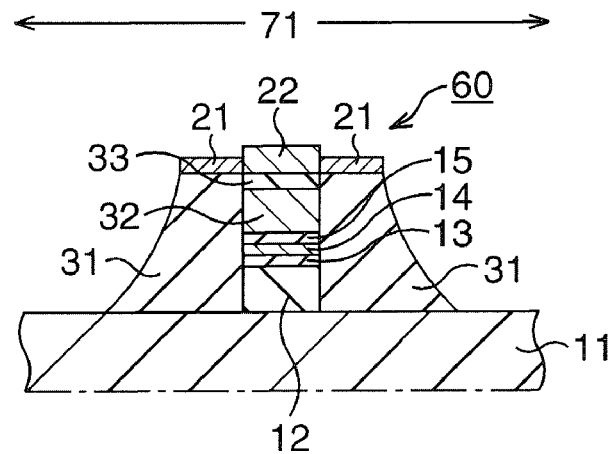
FIGS. 16A to 16C are schematic sectional views along dashed lines I-I, II-II, and III-III in FIG. 13.
Figure 16B:
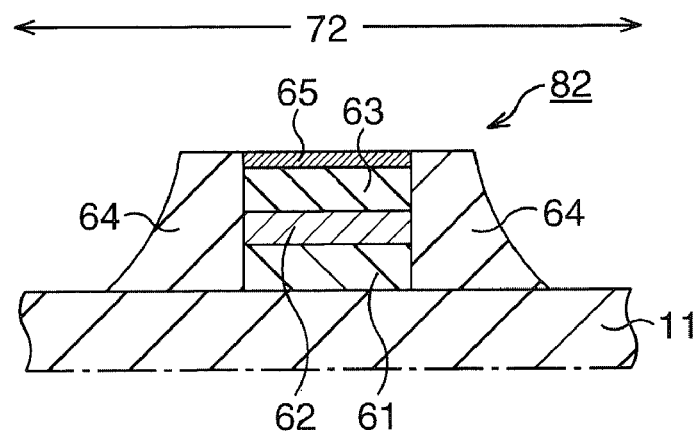
Figure 16C:
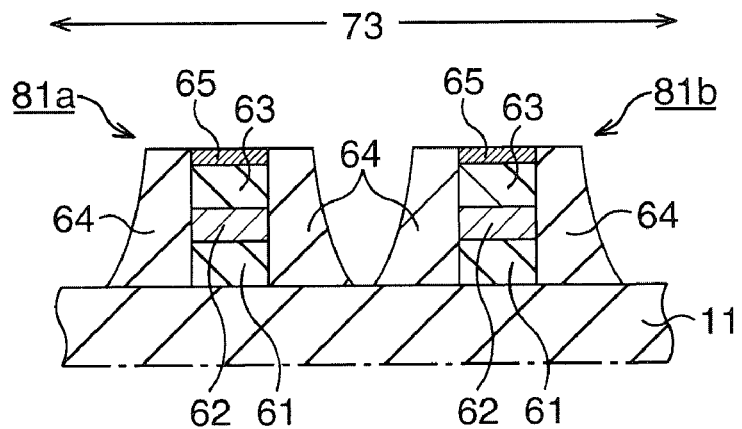

Here, FIG. 14A, FIG. 15A, and FIG. 16A correspond to FIG. 10-2A (schematic section of SOA 60: as well as that of SOAs 80a to 80h). FIG. 14B, FIG. 15B, and FIG. 16B correspond to FIG. 10-2B (schematic section of optical coupler 82). FIG. 14C, FIG. 15C, and FIG. 16C correspond to FIG. 10-2C (schematic sections of optical waveguide portions 81a to 81h (81a and 81b among them): optical waveguide portion 83 is also formed in the same manner).

First, as shown in FIG. 11 and FIGS. 14A to 14C, on the n-InP substrate 11, the n-InP buffer layer 12, the light confinement layer 13, the active layer 14, the light confinement layer 15, and the p-InP cladding layer 32 are sequentially formed in a forming region 71 of the SOA, and the n-InP cladding layer 61, the core layer 62, and the p-InP cladding layer 63 are sequentially formed in a forming region 72 of the optical coupler and in a forming region 73 of the optical waveguide portion, respectively.

Specifically, n-InP having, for instance, about 200 nm in film thickness is epitaxially grown on the whole surface of the n-InP substrate 11, using a MOCVD (metal organic chemical vapor deposition) method. The n-InP becomes the n-InP buffer layer 12 in the forming region 71 of the SOA, and it becomes the n-InP cladding layer 61 in the forming region 72 of the optical coupler and in the forming region 73 of the optical waveguide portion.

Next, with the use of the MOCVD method, i-InGaAsP having, for instance, about 100 nm in film thickness and an emission wavelength of about 1.3 μm is epitaxially grown on the whole surface of the n-InP substrate 11, to thereby form the light confinement layer 13 to be composing members of the SOAs 80a to 80h and 60.

Subsequently, by using the MOCVD method, GaInAs having, for example, about 10 nm in film thickness with tensile strain applied thereto, and GaInNAs (nitrogen (N) composition ratio of 0.1%) having, for example, about 5 nm in film thickness with no strain applied thereto are sequentially epitaxially grown so that four layers of each of the layers are alternately grown (in four cycles). In the forming region 71 of the SOA, as the composing members of the SOAs 80a to 80h and 60, the GaInAs and the GaInNAs respectively become the barrier layer 14a and the well layer 14b, which compose the active layer 14 with the MQW structure formed by alternately laminating four layers of each of the layers.

Next, with the use of the MOCVD method, i-InGaAsP having about 100 nm in film thickness and the emission wavelength of about 1.3 μm, and p-InP having about 200 nm in film thickness are sequentially epitaxially grown on the whole surface of the n-InP substrate 11. In the forming region 71 of the SOA, as the composing members of the SOAs 80a to 80h and 60, the i-InGaAsP and the p-InP respectively become the light confinement layer 15 and a part of the p-InP cladding layer 32.

Subsequently, after being deposited on the whole surface, a silicon oxide film (not shown) is processed by lithography and dry etching so that the silicon oxide film is remained only in the forming region 71 of the SOA. Dry etching is conducted using the silicon oxide film as a mask, and the p-InP cladding layer 32, the light confinement layer 15, the active layer 14, and the light confinement layer 13 in the forming region 72 of the optical coupler and in the forming region 73 of the optical waveguide portion are removed.

Next, in the forming region 72 of the optical coupler and in the forming region 73 of the optical waveguide portion from which the silicon oxide film is removed, i-InGaAsP having about 200 nm in film thickness and a composition wavelength of about 1.3 μm, and p-InP having about 300 nm in film thickness are sequentially butt-joint grown. As composing members of the optical waveguide portions 81a to 81h and 83, and of the optical coupler 82, the i-InGaAsP and the p-InP respectively become the core layer 62 and a part of the p-InP cladding layer 63.

Subsequently, after removing the silicon oxide film used as the mask by wet etching and the like, with the use of the MOCVD method, p-InP having about 2 μm in film thickness and p-InGaAsP having about 500 nm in film thickness and the composition wavelength of about 1.3 μm are sequentially epitaxially grown on the whole surface of the n-InP substrate 11. As the composing members of the SOAs 80a to 80h and 60, the p-InP and the p-InGaAsP respectively become a part of the p-InP cladding layer 32 and the p-InGaAsP contact layer 33 in the forming region 71 of the SOA. Further, as the composing members of the optical waveguide portions 81a to 81h and 83, and of the optical coupler 82, the p-InP and the p-InGaAsP respectively become a part of the p-InP cladding layer 63 and the p-InGaAsP contact layer 65.

Next, as shown in FIG. 12 and FIGS. 15A to 15C, a stripe-shaped mesa structure composed of the n-InP buffer layer 12, the light confinement layer 13, the active layer 14, the light confinement layer 15, the p-InP cladding layer 32, and the p-InGaAsP contact layer 33 is formed in the forming region 71 of the SOA, a stripe-shaped mesa structure composed of the n-InP cladding layer 61, the core layer 62, the p-InP cladding layer 63, and the p-InGaASP contact layer 65 is formed in the forming region 73 of the optical waveguide portion, and a triangular-shaped mesa structure composed in the same manner as in the forming region 73 of the optical waveguide portion is formed in the forming region 72 of the optical coupler, in which the structures are formed in an integrally connected shape, as shown in FIG. 10-1, for instance.

Specifically, a silicon oxide film 66, after being deposited on the whole surface of the n-InP substrate 11, is processed by lithography and dry etching. Here, the silicon oxide film 66 is processed to have an integral shape same as the SOAs 80a to 80h, the optical waveguide portions 81a to 81h, the optical coupler 82, the optical waveguide portion 83, and the SOA 60 except the portions of the current constriction structures 31 and 64 shown in FIG. 10-1.

Subsequently, using the silicon oxide film 66 as a mask, mesa etching is conducted by, for example, the ICP-reactive ion etching (RIE).

At this time, the InGaAsP contact layer 33, the p-InP cladding layer 32, the light confinement layer 15, the active layer 14, the light confinement layer 13, and the n-InP buffer layer 12 are processed in the forming region 71 of the SOA. Further, the InGaAsP contact layer 65, the p-InP cladding layer 63, the core layer 62, and the n-InP cladding layer 61 are processed in the forming region 72 of the optical coupler and in the forming region 73 of the optical waveguide portion.

Accordingly, a series of mesa structures following the shape of the silicon oxide film 66 and made by connecting the respective stripe-shaped mesa structures and the triangular-shaped mesa structure are formed.

Next, as shown in FIG. 13 and FIGS. 16A to 16C, the current constriction structures 31 and 64 are formed in the series of mesa structures.

Specifically, by continuously employing the silicon oxide film 66 as a mask for selective growth, a semi-insulating InP in which iron (Fe), for instance, is doped, is selectively grown on both side walls of the series of mesa structures evenly and uniformly using the MOCVD method, to thereby form the current constriction structures 31 and 64.

After that, the silicon oxide film 66 used as the mask is removed by wet etching and the like.

Thereafter, similar to shown in FIG. 7D and FIG. 6, the p-type electrode 22 and the n-type electrode 23 being the SOA electrodes, and the non-reflective coating films 24 and 25 are formed, and the chip cleaving is conducted, and after these processes, the SOAs 80a to 80h, the optical waveguide portions 81a to 81h, the optical coupler 82, the optical waveguide portion 83, and the SOA 60 are formed, to thereby complete the optical gate switch. Note that in FIG. 16C, illustrations of the n-type electrode 23 and the non-reflective coating films 24 and 25 are omitted.

As described above, according to the present embodiment, it is possible to realize a highly reliable optical gate switch capable of realizing a flat gain spectrum and a low noise figure in a wide wavelength region including not only a longer wavelength side thereof but also a shorter wavelength side thereof, and capable of keeping a small gain difference between wavelengths, while maintaining a gain peak wavelength at, for example, in the vicinity of the center of 1.55 μm band.

Note that the SOA disclosed in the first embodiment can be integrated, for instance, on a single substrate, together with functional elements such as a semiconductor laser, an optical modulator, a phase modulator, an optical filter, an optical coupler, and the like, for example, in addition to the SOA module and the optical gate switch, which enables to realize a device structure with various functions.

According to the present invention, it is possible to obtain a highly reliable semiconductor optical amplifying device and a semiconductor optical amplifying system capable of realizing a flat gain spectrum and a low noise figure in a wide wavelength region including not only a longer wavelength side thereof but also a shorter wavelength side thereof, and capable of keeping a small gain difference between wavelengths, while maintaining a gain peak wavelength at, for example, in the vicinity of the center of 1.55 μm band.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. A semiconductor optical amplifying device, comprising:
    a semiconductor substrate; and
    an active layer provided over said semiconductor substrate,
    wherein an incident signal light being incident from a light incident end surface of said active layer is amplified to be radiated as a radiation signal light from a light radiation end surface of said active layer while suppressing resonances of the light caused by reflections at the light incident end surface and the light radiation end surface, and a gain that the radiation signal light achieves is kept constant without depending on a polarization state of the incident signal light;
    said semiconductor substrate is made of InP; and
    said active layer takes a multiple quantum well structure formed of a barrier layer made of GaInAs with tensile strain applied thereto and a well layer made of GaInNAs alternately laminated in one or a plurality of layers,
    wherein a range of the amount of compressive strain applied to the well layer is not less than 0.1% nor more than 0.3% and a range of the amount of tensile strain applied to the barrier layer is not less than 0.5% nor more than 1.2%.

2. The semiconductor optical amplifying device according to claim 1,
    wherein a composition ratio of nitrogen (N) in GaInNAs of the well layer is within a range of not less than 0.05% nor more than 0.5%.

3. The semiconductor optical amplifying device according to claim 1, further comprising
    a pair of cladding layers vertically sandwiching said active layer.

4. The semiconductor optical amplifying device according to claim 3,
    wherein said cladding layers are formed to cover end tip surfaces of said active layer in the light incident end surface and the light radiation end surface.

5. The semiconductor optical amplifying device according to claim 1, further comprising
    a current constriction structure burying a periphery of said active layer with a multi-layered body of a p-type InP and an n-type InP.

6. The semiconductor optical amplifying device according to claim 1, further comprising
    a current constriction structure burying a periphery of said active layer with a semi-insulating InP.

7. The semiconductor optical amplifying device according to claim 1,
    wherein said active layer is formed such that a width thereof gradually narrows from a center portion toward the respective light incident end surface and light radiation end surface.

8. The semiconductor optical amplifying device according to claim 1,
    wherein said active layer is formed to have an angled from a vertical direction with respect to cleaved surfaces of said semiconductor substrate.

* * * * *